US012062743B2

(12) United States Patent
Chen et al.

(10) Patent No.: US 12,062,743 B2
(45) Date of Patent: *Aug. 13, 2024

(54) ELECTRONIC DEVICE

(71) Applicant: Innolux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/080,747

(22) Filed: Dec. 14, 2022

(65) Prior Publication Data

US 2023/0114578 A1    Apr. 13, 2023

Related U.S. Application Data

(63) Continuation of application No. 17/086,470, filed on Nov. 2, 2020, now Pat. No. 11,557,701.

(30) Foreign Application Priority Data

Nov. 27, 2019 (CN) .......................... 201911181505.1

(51) Int. Cl.
*H01L 33/54* (2010.01)
*H01L 25/075* (2006.01)
*H01L 33/44* (2010.01)
*H01L 33/48* (2010.01)
*H01L 33/50* (2010.01)
*H01L 33/56* (2010.01)

(52) U.S. Cl.
CPC ............ *H01L 33/54* (2013.01); *H01L 33/486* (2013.01)

(58) Field of Classification Search
CPC ..... H01L 33/50; H01L 33/505; H01L 33/486; H01L 33/54; H01L 33/504; H01L 33/56
See application file for complete search history.

(56) References Cited

U.S. PATENT DOCUMENTS

| 11,557,701 | B2 * | 1/2023 | Chen | H01L 33/505 |
| 2011/0211334 | A1 * | 9/2011 | Kim | H01L 33/54 |
| | | | | 313/317 |
| 2018/0277721 | A1 * | 9/2018 | Bando | H01L 33/502 |
| 2020/0313047 | A1 * | 10/2020 | Yamada | H01L 33/56 |

FOREIGN PATENT DOCUMENTS

CN           102214774         10/2011

OTHER PUBLICATIONS

"Office Action of China Counterpart Application", issued on Dec. 11, 2023, p. 1-p. 6.

* cited by examiner

*Primary Examiner* — Antonio B Crite
(74) *Attorney, Agent, or Firm* — JCIPRNET

(57) ABSTRACT

An electronic device including a substrate and at least one light emitting unit is provided. The at least one light emitting unit is disposed on the substrate. The at least one light emitting unit includes a light emitting diode and a protective layer. The protective layer includes a portion overlapped with the light emitting diode, and the portion has a concave part adjacent to an edge of the light emitting diode in a top view of the electronic device.

9 Claims, 17 Drawing Sheets

ELECTRONIC DEVICE

CROSS-REFERENCE TO RELATED APPLICATION

This application is a continuation application of U.S. application Ser. No. 17/086,470, filed on Nov. 2, 2020, which claims the priority benefit of Chinese patent application serial no. 201911181505.1, filed on Nov. 27, 2019. The entirety of each of the above-mentioned patent applications is hereby incorporated by reference herein and made a part of this specification.

BACKGROUND OF THE DISCLOSURE

Technical Field

The present disclosure relates to an electronic device.

Description of Related Art

Electronic products have become an indispensable necessity in modern society. With the rapid development of the electronic products, consumers have very high expectations for the quality, function, or cost of these products.

Therefore, the electronic products need to be improved. However, there are still some issues to be solved in current electronic products.

SUMMARY

The present disclosure is directed to an electronic device and a manufacturing method thereof, and provides an electronic device that may reduce the influence from the outside or a subsequent process on the light emitting diode, or an electronic device that improves luminance performance or reliability, but the present disclosure is not limited thereto.

According to an embodiment of the present disclosure, the electronic device includes a substrate and at least one light emitting unit disposed on the substrate. The light emitting unit includes a light emitting diode and a protective layer. The protective layer includes a portion overlapped with the light emitting diode, and the portion has a concave part adjacent to an edge of the light emitting diode in a top view of the electronic device.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
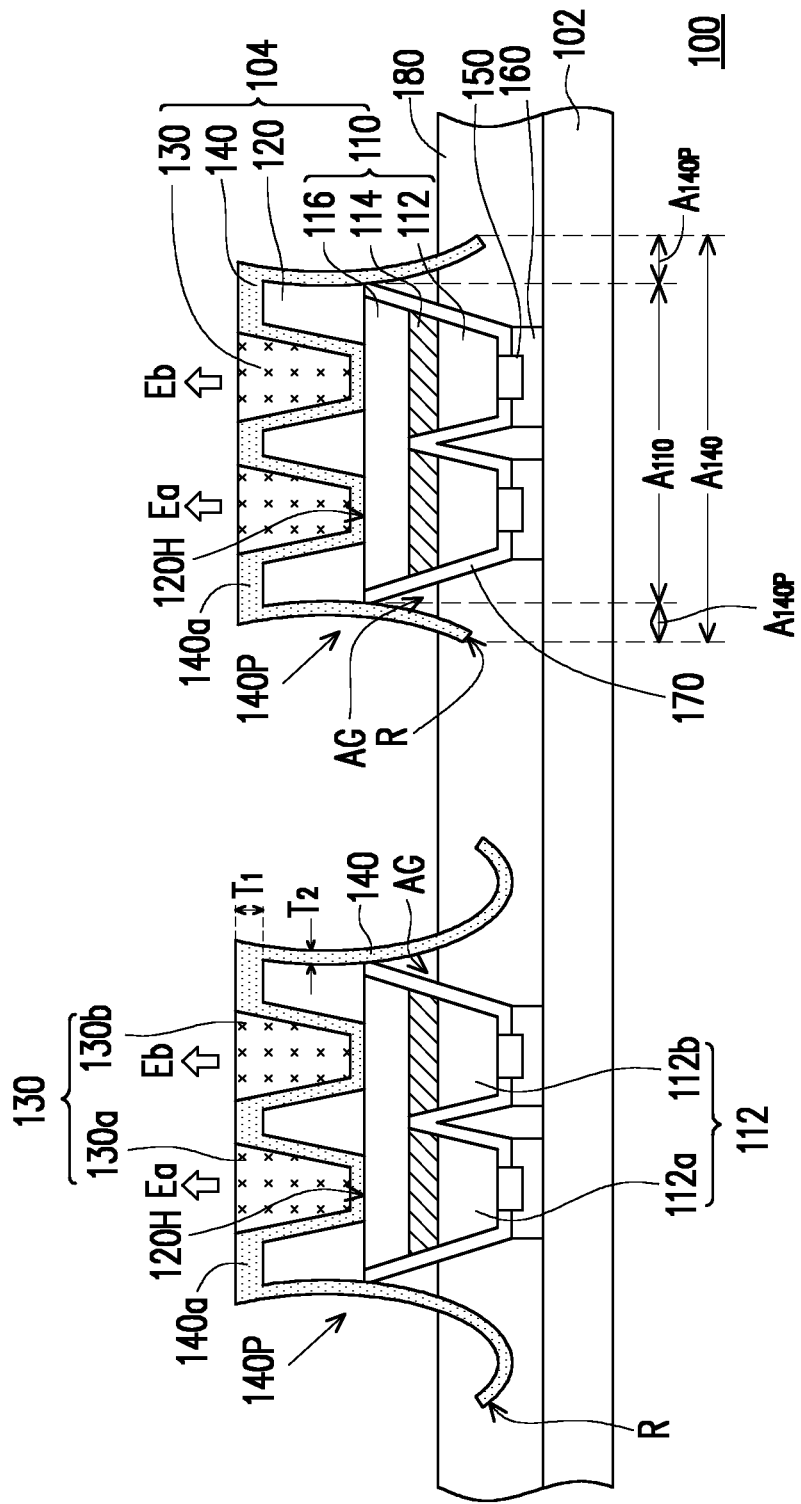
FIG. 1 is a cross-sectional view of an electronic device of an embodiment of the present disclosure.

A structure (or layer, component, or substrate) described in the present disclosure disposed on or above another structure (or layer, component, or substrate) may mean that the two structures are adjacent and directly connected, or may mean that two structures are adjacent rather than directly connected. Indirect connections refer to at least one intermediate structure (or intermediate layer, intermediate component, intermediate substrate, or intermediate spacing) between two structures. The lower side surface of a structure is adjacent or directly connected to the upper side surface of the intermediate structure, the upper side surface of another structure is adjacent or directly connected to the lower side surface of the intermediate structure, and the intermediate structure may be formed by a single layer or a plurality of layers of physical structures or non-physical structures, and is not limited. The electrical connection or coupling described in the present disclosure may refer to direct connection or indirect connection. In the case of direct connection, the endpoints of the components in two circuits are directly connected or connected to each other via a conductor line segment. In the case of indirect connection, there are switch(es), diode(s), capacitor(s), inductor(s), resistor(s), other suitable components, or a combination of the above components between the endpoints of the components in the two circuits. However, the present disclosure is not limited thereto.

In the present disclosure, the length and width may be measured by using an optical microscope, and the thickness may be measured by using a cross-sectional image in an electron microscope, but the present disclosure is not limited thereto. Moreover, a certain error may exist between any two competing values or directions. If a first value is equal to a second value, then the first value and the second value may have a 10% error; if a first direction is perpendicular to a second direction, then the angle between the first direction and the second direction may be between 80 degrees and 100 degrees; and if the first direction is parallel to the second direction, then the angle between the first direction and the second direction may be between 0 degrees and 10 degrees.

In the present disclosure, the "color of emitted light" of a light emitting layer means that after the light emitting layer is disposed between two electrodes and a current flows through the light emitting layer, after the electromagnetic radiation generated by the light emitting layer is received by an observer's eyes, for the colors perceived by the observer, different colors of the emitted light correspond to different colors at this time. Alternatively, the electromagnetic radiation may also be invisible light. At this time, one corresponding frequency spectrum is obtained after measurement by an instrument, and different colors of the emitted light correspond to different frequency spectra.

In the present disclosure, the various embodiments described below may be used in combination and without departing from the spirit and scope of the present disclosure. For example, some features of one embodiment may be combined with some features of another embodiment to become another embodiment.

Hereinafter, exemplary embodiments of the present disclosure are described in detail, and examples of the exemplary embodiments are conveyed via the figures. Wherever possible, the same reference numerals are used in the figures and the descriptions to refer to the same or similar portions.

FIG. 1 is a view of an electronic device of an embodiment of the present disclosure. Referring to FIG. 1, an electronic device 100 includes a substrate 102 and at least one light emitting unit 104. The electronic device 100 may be a display device, a sensing device, a lighting device, an antenna device, a tiled device, other suitable devices, or a combination of the above devices, but the present disclosure is not limited thereto. In at least some embodiments, the substrate 102 may be a rigid substrate or a flexible substrate, such as a transparent plastic substrate or a glass substrate. For example, the material of the substrate 102 includes glass, quartz, sapphire, ceramic, polycarbonate (PC), polyimide (PI), polyethylene terephthalate (PET), liquid-crystal polymer (LCP), rubber, glass fiber, other suitable substrate materials, or a combination of the above, but the present disclosure is not limited thereto.

The light emitting unit 104 may include a light emitting diode 110, a protective layer 140, and a light conversion layer 130. The light emitting unit 104 is disposed on the substrate 102. The number of the light emitting unit 104 may be a plurality, and the light emitting units 104 may be disposed on the substrate 102 independently of each other. In addition, in the present embodiment, the light emitting unit 104 is exemplified by an integrated LED. Specifically, in the integrated light emitting diode of the present embodiment, the light emitting unit 104 has a plurality of light emitting regions that may be controlled independently such as a light emitting region Ea and a light emitting region Eb, and the light conversion layer 130 may include a plurality of light conversion pattern 130a and light conversion pattern 130b respectively disposed in the light emitting region Ea and the light emitting region Eb. In other embodiments, the light emitting unit 104 may also be a single light emitting diode (single LED) (described later).

As shown in FIG. 1, two light emitting units 104 may be disposed on the substrate 102 electrically independent and structurally independent of each other. In the present embodiment, an example in which the protective layer 140 may be disposed between the light emitting diode 110 and the light conversion layer 130 is provided.

Referring to FIG. 1, the light emitting diode 110 may sequentially include, from a side of the light emitting diode 110 adjacent to the substrate 102, a first doped semiconductor layer 112, an active layer 114, and a second doped semiconductor layer 116. The first doped semiconductor layer 112 may include one of an N-type semiconductor layer and a P-type semiconductor layer (for example, an N-type semiconductor layer), and the second doped semiconductor layer 116 may include the other of the N-type semiconductor layer and the P-type semiconductor layer (for example, a P-type semiconductor layer). The active layer 114 may include a single-layered quantum well structure or a multi-layered quantum well structure. The N-type semiconductor layer may include lnxAlyGa(1−x−y)N having an N-type dopant (such as silicon, germanium, tin, and/or the like), wherein 0≤x≤1, 0≤y≤1, 0≤x+y≤1. lnxAlyGa(1−x−y)N may be, for example, indium aluminum gallium nitride (InAlGaN), gallium nitride (GaN), aluminum gallium nitride (AlGaN), indium gallium nitride (InGaN), aluminum nitride, or indium nitride (InN), but the present disclosure is not limited thereto. The P-type semiconductor layer may include lnxAlyGa(1−x−y)N having a P-type dopant (such as magnesium or a similar dopant), which is not repeated herein.

More specifically, in the integrated light emitting diode 110 of the present embodiment, the first doped semiconductor layer 112 may include a first doped semiconductor pattern 112a and a first doped semiconductor pattern 112b. Electrodes 150 may be electrically connected to pads 160 disposed on the substrate 102, whereby a control signal may be entered into the light emitting diode 110 via the pads 160 and the electrodes 150, and the light emitting region of the light emitting diode 110 may emit light by region, and the corresponding light emitting regions Ea and Eb in the light emitting unit 104 may emit light by region, but the present disclosure is not limited thereto.

Referring to FIG. 1, the light emitting unit 104 includes a protective layer 140 and a light conversion layer 130 disposed on the light emitting diode 110. In the present embodiment, the protective layer 140 may be disposed between the light conversion layer 130 and the light emitting diode 110. More specifically, the light emitting unit 104 may include a light conversion layer fixing structure 120 disposed on the light emitting diode 110, and the light conversion layer 130 may be disposed in a recess 120H of the light conversion layer fixing structure 120. A portion of the protective layer 140 may be disposed between the light conversion layer 130 and the light conversion layer fixing structure 120 filled in the recess 120H along the topography of the recess 120H of the light conversion layer fixing structure 120. The material of the protective layer 140 may include a material having a light transmittance equal to or greater than 50%, such as an inorganic material of an oxide film or a nitride film, such as silicon oxide (SiOx) or silicon nitride (SiNx), or an organic material, and the present disclosure is not limited thereto. The organic material may include epoxy resin, acrylic resin (e.g., polymethyl methacrylate (PMMA)), benzocyclobutene, polyimide, polyester, polydimethylsiloxane, or polyfluoroalkoxy, other suitable organic materials, or a combination thereof. The material of the light conversion layer 130 may include a quantum dot (QD) material, an organic light emitting material, an inorganic light emitting material, a fluorescent material, a phosphor material, a color filter material, other suitable materials, or a combination of the above, but the present disclosure is not limited thereto.

As shown in FIG. 1, the protective layer 140 includes a portion 140P, and the portion 140P may have a ripped section R and is not overlapped with the light emitting diode 110 in a top view direction of the electronic device 100. More specifically, the top view direction of the electronic device 100 is, for example, the normal direction of the substrate 102. In the present disclosure, "not overlapped with the light emitting diode 110" may mean that the portion 140P of the protective layer 140 and the orthographic projection region of the light emitting diode 110 on the substrate 102 are not overlapped. In an embodiment, as shown in FIG. 1, an orthographic projection region $A_{140}$ of the protective layer 140 on the substrate 102 may be greater than an orthographic projection region $A_{110}$ of the light emitting diode 110 on the substrate 102. The orthographic projection region of the portion 140P of the protective layer 140 having the ripped section R on the substrate 102 may be, for example, a region Amp in which the orthographic projection region $A_{140}$ of the protective layer 140 on the substrate 102 and the orthographic projection region $A_{110}$ of the light emitting diode 110 on the substrate 102 are not overlapped. In some embodiments, the portion 140P may include a portion extending toward the substrate 102 and/or a portion extending in a direction away from the substrate 102.

In an embodiment, the portion 140P of the protective layer 140 with the ripped section R may be not in contact with the light emitting diode 110. In detail, the protective layer 140 may include a top portion 140a covering the top surface of the light conversion layer fixing structure 120 and the portion 140P extending outward and not in contact with the light emitting diode 110. As shown in FIG. 1, the protective layer 140 is disposed adjacent to at least a portion of the top surface and the side surface of the light emitting diode 110, and may have the effect of alleviating the intrusion of water vapor and oxygen to reduce the deterioration or damage of the light emitting diode due to the intrusion of water vapor and oxygen or the like. In addition, the protective layer 140 extending outward from the light emitting diode 110 may reduce contact of a film layer formed in a subsequent process with the light emitting diode 110, thereby reducing the influence of the subsequent process on the performance of the light emitting diode 110.

In the present embodiment, the light emitting unit 104 may include a plurality of light emitting region Ea and light emitting region Eb. The light conversion layers 130 in the different light-emitting region Ea and light-emitting region Eb may be configured with the light conversion pattern 130a and the light conversion pattern 130b of different colors or the same color. By independently controlling the first doped semiconductor layer 112, the active layer 114, and the second doped semiconductor layer 116 corresponding to the light emitting region Ea and the light emitting region Eb, the light emitting unit 104 may emit light of different colors in the different light emitting region Ea and light emitting region Eb and the corresponding light conversion layer 130. The light conversion pattern 130a and the light conversion pattern 130b may be a suitable material converting light emitted from the light emitting diode 110 into green, red, blue, or other colors.

In addition, the light emitting unit 104 may include a cover layer 170 covering at least a portion of the sidewall and the bottom surface of the light emitting diode 110 to further protect the light emitting diode 110. The material of the cover layer 170 includes an inorganic material, such as an oxide film or a nitride film, but the present disclosure is not limited thereto. The cover layer 170 may be a composite layer. For example, the cover layer 170 may include a plurality of reflective layers (such as an inorganic multi-layered film), or the cover layer 170 may include an insulating layer and a metal layer, and the insulating layer is disposed between the metal layer and the light emitting diode 110. As shown in FIG. 1, the electrodes 150 may be exposed from the opening of the cover layer 170 and electrically connected to the pads 160 on the substrate 102.

In an embodiment of the present disclosure, the electronic device 100 further includes an insulating layer 180 disposed on the substrate 102. The insulating layer 180 may be in contact with the portion 140P of the protective layer 140 to further reduce the external influence on the performance of the light emitting diode 110. As shown in FIG. 1, the thickness of the insulating layer 180 may be less than the height of the light emitting diode 110, but the present disclosure is not limited thereto. In the present embodiment, an air gap AG is formed among the surface of the insulating layer 180, the cover layer 170, and the portion 140P of the protective layer 140 to help provide a space for heat dissipation when the light emitting diode 110 emits light or to reduce external environment influence on the light emitting diode 110.

In an embodiment, a thickness $T_1$ of the portion of the protective layer 140 overlapped with the light emitting diode 110 may be greater than a thickness $T_2$ of the portion 140P of the protective layer 140 not overlapped with the light emitting diode 110. In the present disclosure, the maximum thickness of the top portion 140a measured by taking the ripped section along the normal direction of the substrate 102 may be set as the thickness $T_1$, and the maximum thickness of the portion 140P measured by taking the ripped section along the partial extending direction perpendicular to the portion 140P is set as the thickness $T_2$.

FIG. 2A to FIG. 2G are top views of a portion of a manufacturing process of an electronic device of an embodiment of the present disclosure, and FIG. 3A to FIG. 3G are cross-sectional views along section line AA' in FIG. 2A to FIG. 2G. It should be understood that according to some embodiments, additional operation steps may be provided before, during, and/or after the manufacturing method of the electronic device of the present disclosure is performed. According to some embodiments, some of the operation steps may be replaced or deleted. According to some embodiments, the order of the operation steps is interchangeable.

Figure 2A:
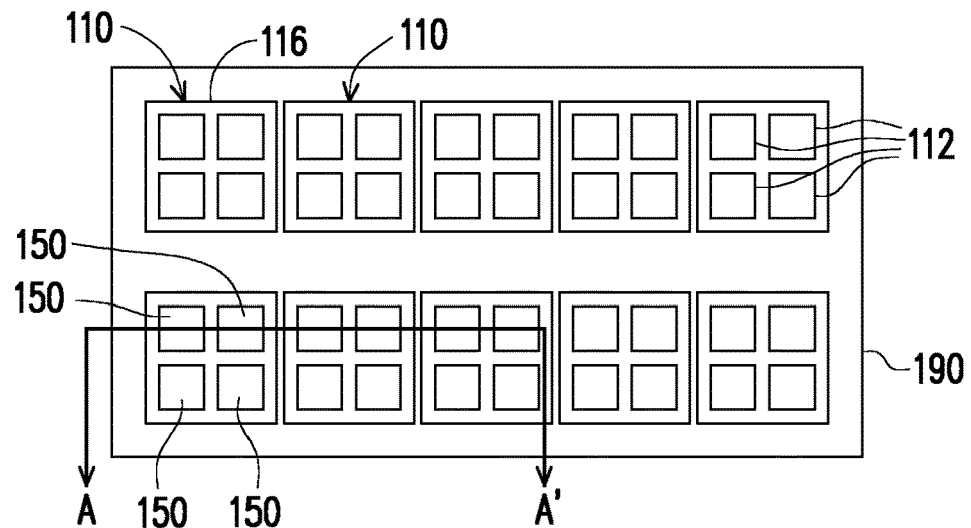
FIG. 2A to FIG. 2G are top views of a portion of a manufacturing process of an electronic device of an embodiment of the present disclosure.
Figure 3A:
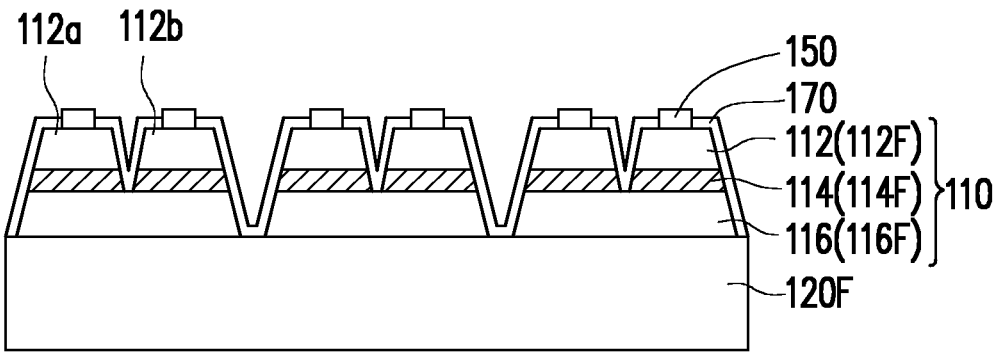
FIG. 3A to FIG. 3G are cross-sectional views along section line AA' in FIG. 2A to FIG. 2G.

Referring to FIG. 2A and FIG. 3A, a substrate 120F is provided. The material of the substrate 120F may include silicon (such as a silicon wafer), sapphire, ceramic, silicon carbide (SiC), gallium nitride (GaN), quartz, glass, or other suitable materials, or a combination of the above, but the present disclosure is not limited thereto. A first doped semiconductor material layer 112F, a second doped semiconductor material layer 116F, and an active material layer 114F are formed on the substrate 120F. The active material layer 114F is disposed between the first doped semiconductor material layer 112F and the second doped semiconductor material layer 116F. Next, the first doped semiconductor material layer 112F, the second doped semiconductor layer material layer 116F, and the active material layer 114F are patterned to form a plurality of light emitting diodes 110 on the substrate 120F, wherein the light emitting diodes 110 include the first doped semiconductor layer 112, the active layer 114, the second doped semiconductor layer 116. The cover layer 170 may cover the first doped semiconductor layer 112, the active layer 114, and the second doped semiconductor layer 116. The cover layer 170 has openings respectively corresponding to the first doped semiconductor patterns (for example, the first doped semiconductor pattern 112a and the first doped semiconductor pattern 112b), and the electrodes 150 are electrically connected to the first doped semiconductor pattern via the openings of the cover layer 170. In an embodiment, there are four electrodes 150 electrically connected to the light emitting diode 110 shown in FIG. 2A, three of the four electrodes 150 may respectively be electrically connected to the first doped semiconductor pattern of the first doped semiconductor layer 112, and the other is electrically connected to the second doped semiconductor layer 116, but the present disclosure is not limited thereto.

Figure 2B:
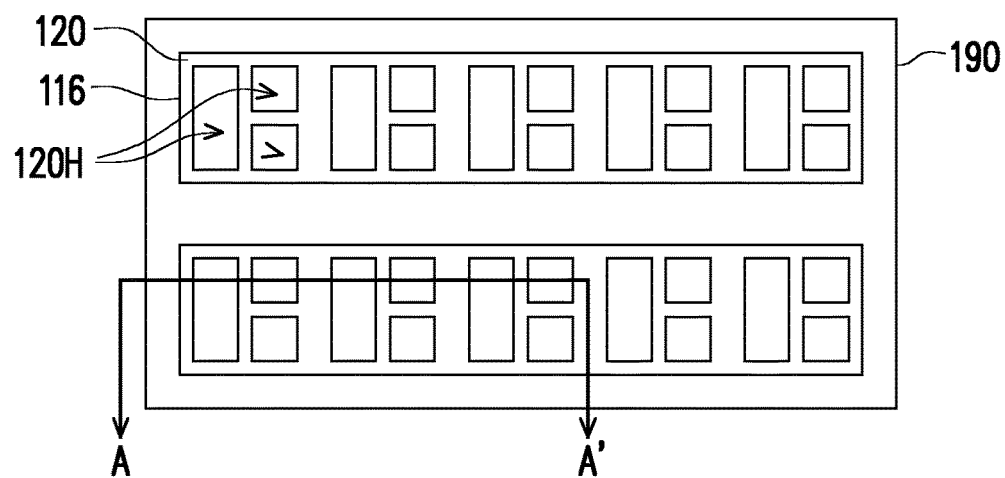
Figure 3B:
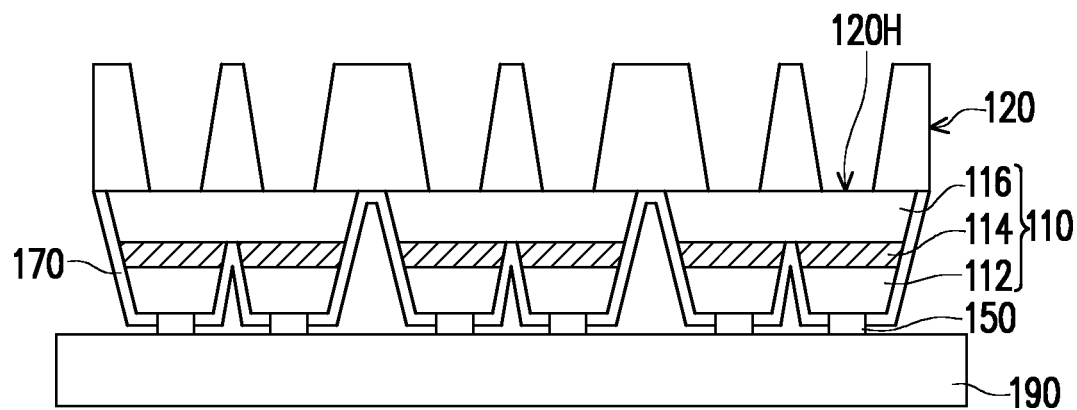

Referring to FIG. 2B and FIG. 3B, the light conversion layer fixing structure 120 is formed. In an embodiment, the light emitting diodes 110 formed on the substrate 120F may be inverted to dispose the electrodes 150 on a first carrier substrate 190. Next, the substrate 120F is patterned to form recesses 120H on the light emitting diodes 110 to form the light conversion layer fixing structure 120. The positions of the recesses 120H in the light conversion layer fixing structure 120 may correspond to the first doped semiconductor pattern 112a and the first doped semiconductor pattern 112b. The number of the recesses 120H may be adjusted according to the predetermined number or positions of the light emitting region Ea and the light emitting region Eb in one light emitting unit 104. For example, in the integrated light emitting diodes of the present embodiment, one light emitting unit 104 may have three light emitting regions. In the present embodiment, three recesses 120H are formed as an example. In a subsequent embodiment, one light emitting unit may have one light emitting region, and the corresponding light emitting diode may also have a single light emitting region. In addition, a method of patterning the substrate 120F may include, for example, forming a patterned photoresist on the substrate 102 and etching the substrate 120F not masked by the patterned photoresist to form the light conversion layer fixing structure 120.

In an embodiment, the plurality of light emitting diodes 110 and the light conversion layer fixing structure 120 formed thereon may be made independent of each other by, for example, using a cutting process, but the present disclosure is not limited thereto.

Figure 2C:
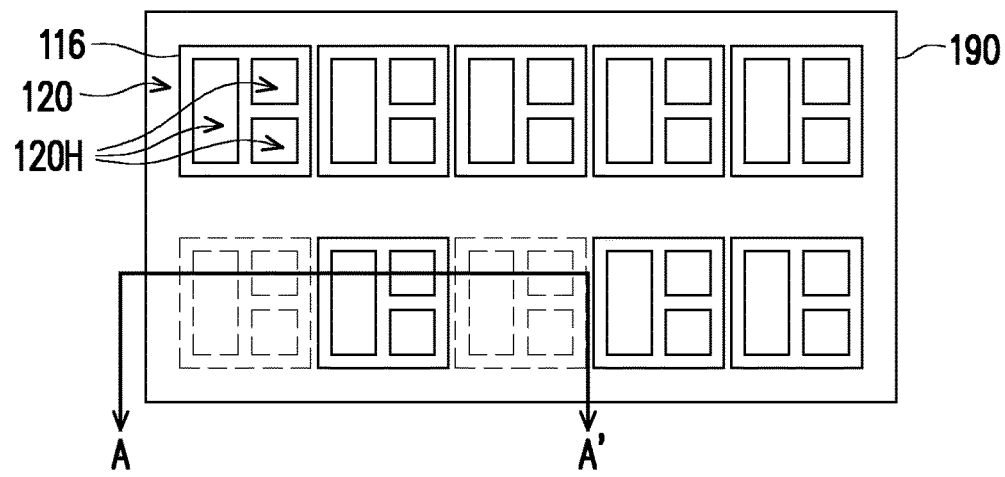
Figure 3C:
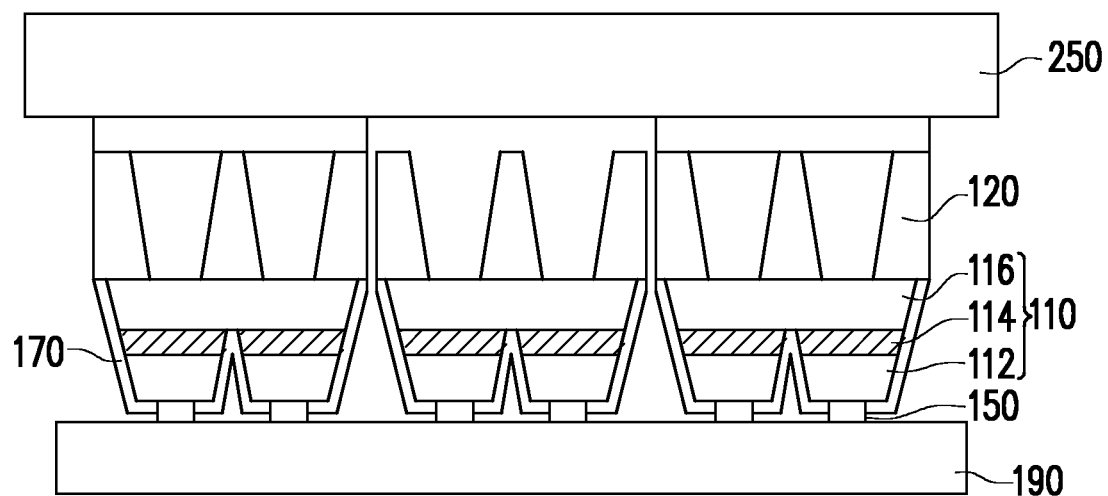

Referring to FIG. 2C and FIG. 3C, the plurality of light emitting diodes 110 and the light conversion layer fixing structure 120 thereof formed on the first carrier substrate 190 are selected in batches according to a preset spacing. For example, the first and third light emitting diodes 110 satisfying the spacing of the arrangement are first selected (as indicated by the dotted lines in FIG. 2C) by a transfer head 250 (as shown in FIG. 3G).

Figure 2D:
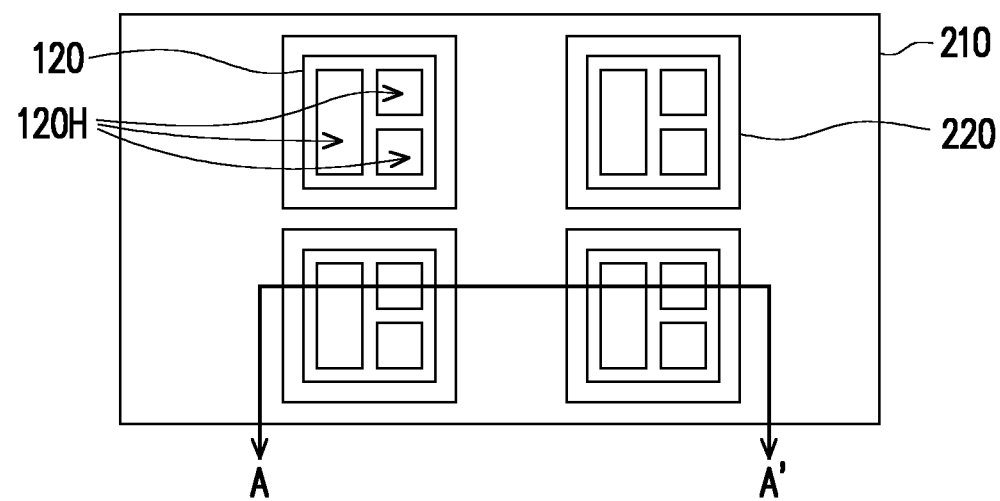
Figure 3D:
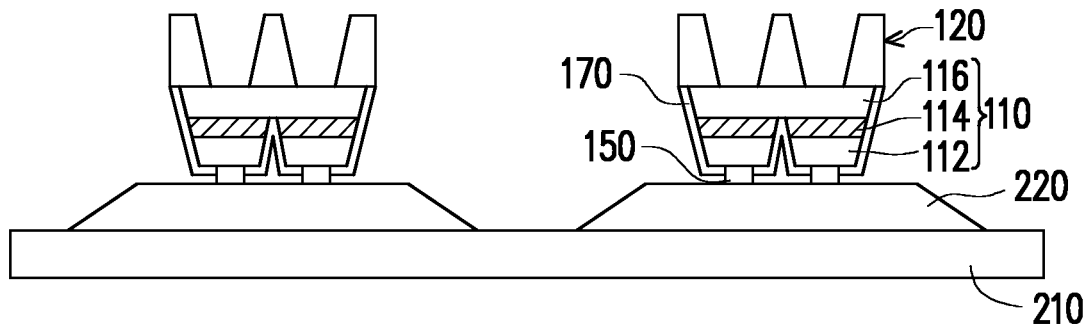

Next, as shown in FIG. 2D and FIG. 3D, the selected light emitting diodes 110 are transferred onto a second carrier substrate 210 having a sacrificial layer 220. In the next sequence, for example, the second and the fourth light emitting diodes 110 of FIG. 2C may be selected and transferred onto the second carrier substrate 210 of FIG. 2D, thereby improving the utilization of the substrate 120F (the substrate 120F may be an epitaxial substrate for forming the light emitting diodes 110).

In an embodiment, after the light emitting diodes 110 are transferred, a detection process may be performed on the light emitting diodes 110 on the second carrier substrate 210. The detection process here may be, for example, a photodetector process and/or a repair process. Whether the light emitting diodes 110 are damaged during the patterning and transfer processes may be detected, and the repair process may be performed as needed. If some of the light emitting diodes 110 cannot be repaired, the defective light emitting diodes 110 are removed first. According to this process, the light emitting diodes 110 may be detected and/or repaired in advance to reduce the defect rate.

Figure 2E:
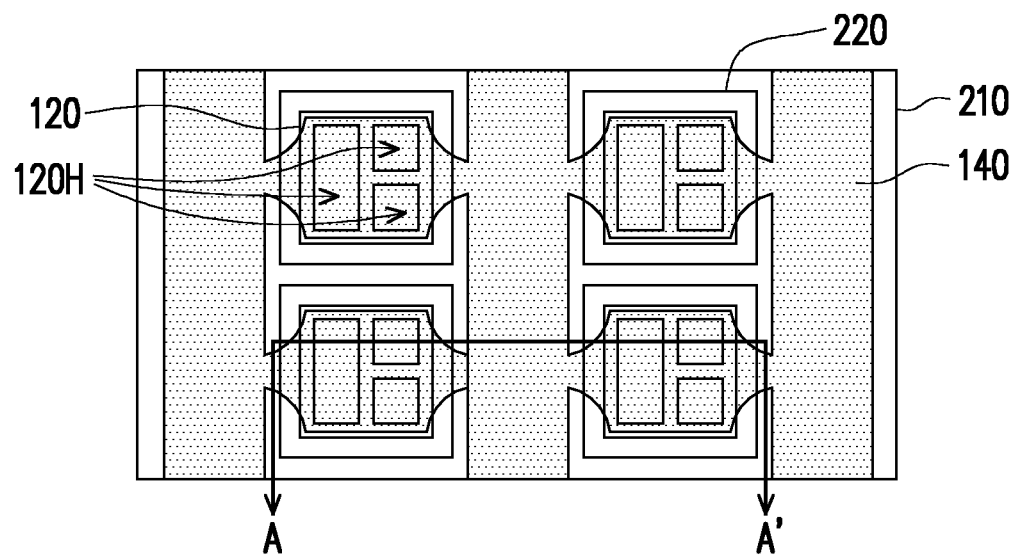
Figure 3E:
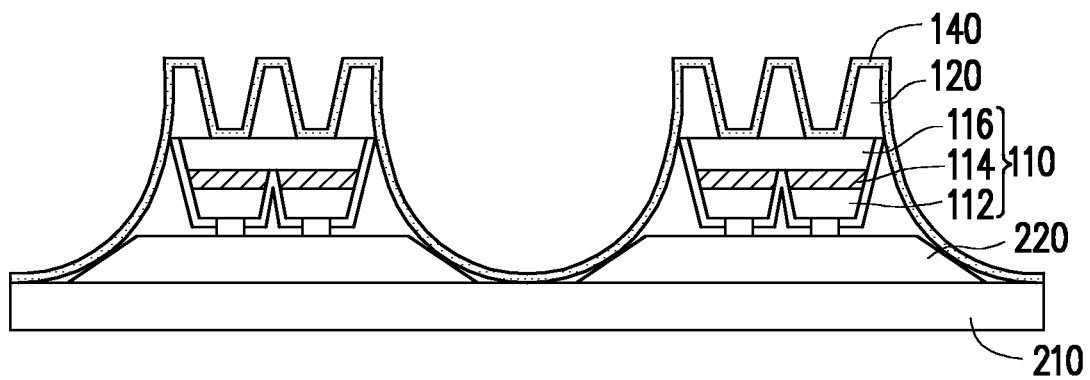

In FIG. 2E and FIG. 3E, the protective layer 140 is formed on the light emitting diodes 110 on the second carrier substrate 210 and the light conversion layer fixing structure 120 thereon. The protective layer 140 may cover the light conversion layer fixing structure 120 and extend outward. The protective layer 140 may be formed by forming an inorganic material or an organic material on the second carrier substrate 210 by a coating process or thin-film deposition. The inorganic material may include, but is not limited to, silicon oxide (SiOx) or silicon nitride (SiNx). The organic material may include a polymer material or an organic insulating layer such as polyfluoroalkoxy or polyimide, but the present disclosure is not limited thereto.

Figure 2F:
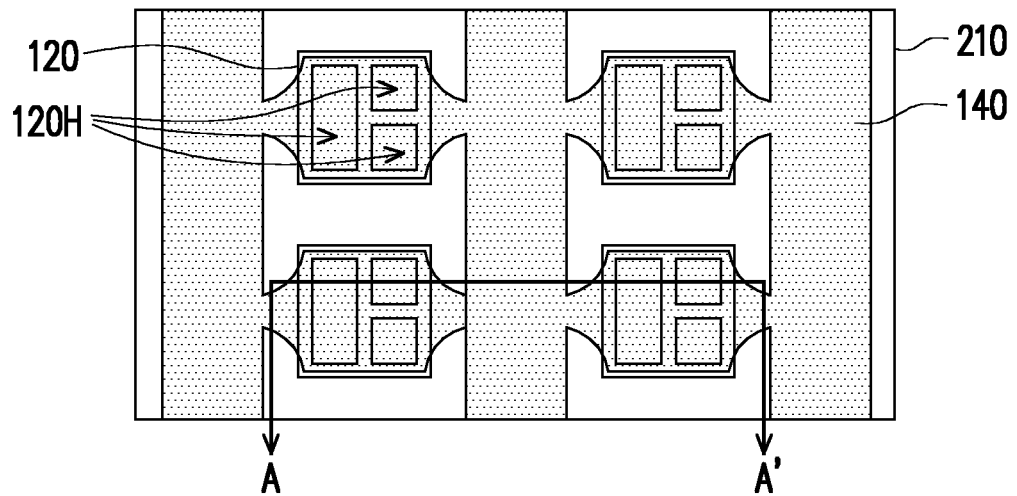
Figure 3F:
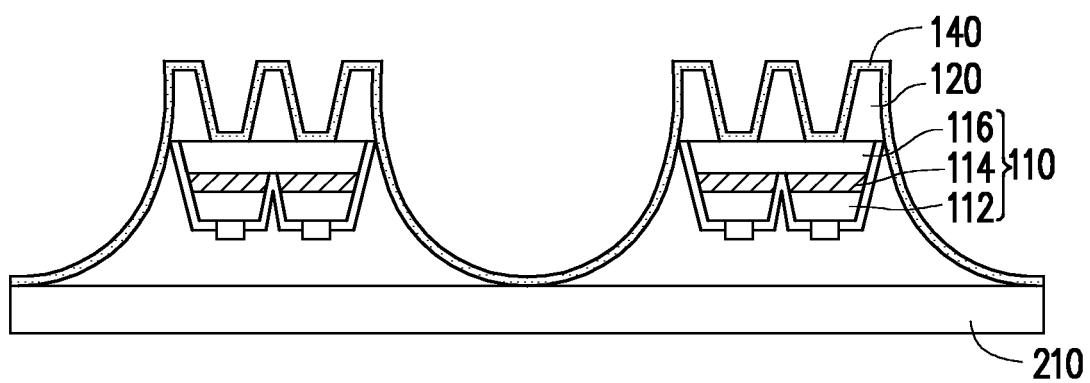
Figure 3G:
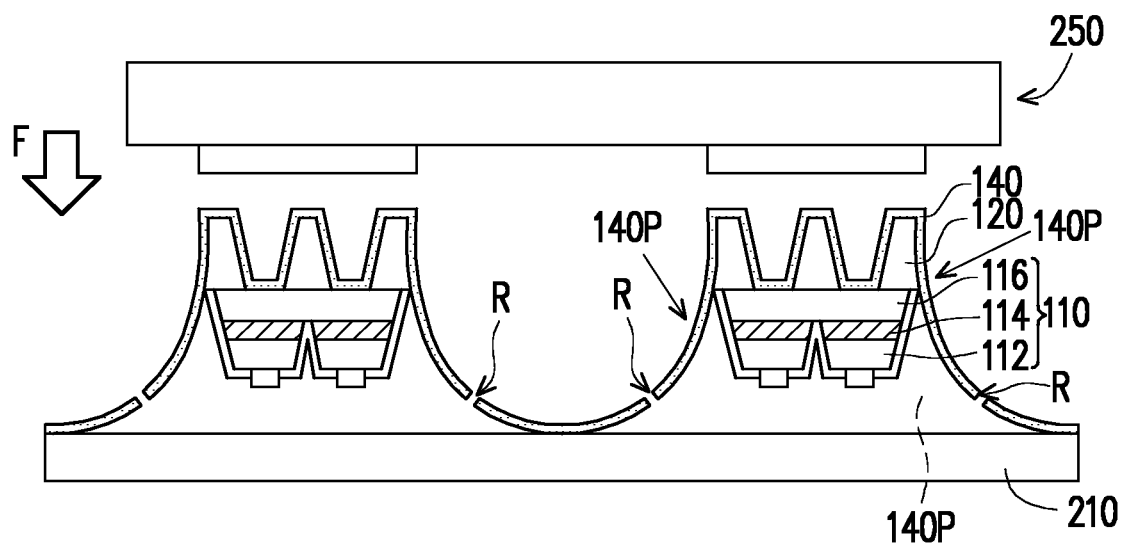

In FIG. 2F and FIG. 3F, the sacrificial layer 220 disposed between the light emitting diodes 110 and the second carrier substrate 210 is removed. The material of the sacrificial layer 220 may include a photoresist material, an organic material, and/or an inorganic material. The photoresist material may include a phenol-formaldehyde resin, an epoxy resin, or a polyisoprene rubber. The inorganic material may include silicon nitride, silicon oxide, silicon oxynitride, or aluminum oxide. The organic material may be as described above and is therefore not repeated herein. The method of removing the sacrificial layer 220 may include dry etching, wet etching, or a combination thereof. Then, a detection process may be performed on the light emitting units 104 with the protective layer 140 on the second carrier substrate 210. The detection process herein, for example, may be a light detection process. For example, the detection process may be a non-destructive detection technique using a high-energy short-wavelength light source to directly irradiate a sample to emit fluorescence. By analyzing the excited fluorescence via a spectrometer, the properties of the material may be obtained from the spectral characteristics, but the present disclosure is not limited thereto.

Figure 2G:
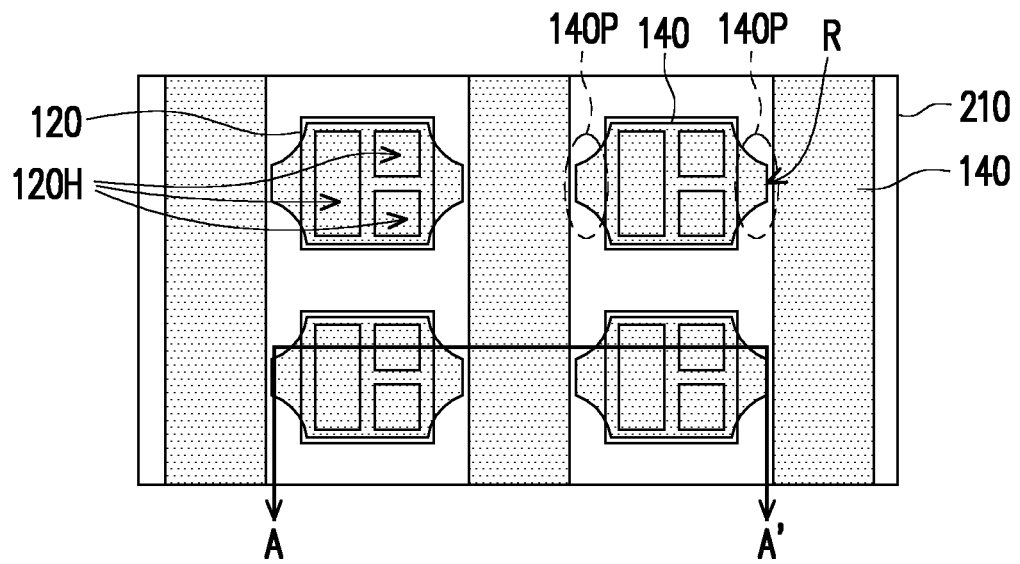

Referring to FIG. 2G and FIG. 3G, the protective layer 140 on the top surface of the light emitting diodes 110 may be attached by using the transfer head 250, such as by a vacuum absorption method or an optical adhesive adhesion method. The transfer head 250 may apply a pressure F in the direction of the second carrier substrate 210, and the pressure make the protective layer 140 move toward the space in which the sacrificial layer 220 is removed to disconnect the part of the protective layer 140 disposed between the light emitting diodes 110. As a result, the portion of the protective layer 140 not overlapped with the light emitting diodes 110 in a top view of the electronic device 100 may form the ripped sections R, and the portion 140P of the protective layer 140 with the ripped section R is formed.

Referring to FIG. 1, next, the light emitting diodes 110 and the protective layer 140 may be transferred onto the target substrate 102 and bonded to the pads 160 on the substrate 102 via the electrodes 150. Specifically, the light emitting diodes 110 and the protective layer 140 may be bonded to the electrodes 150 on the substrate 102 via the electrodes 150 by soldering or the like, but the present disclosure is not limited thereto.

After the bonding, a detection process may be performed on the light emitting diodes 110 on the target substrate 102. For example, a comprehensive electrical detection process or the like may be performed on the light emitting diodes 110. If the result of the detection is normal, a packaging process may be performed. If an abnormality is detected, a repair process may be performed before the packaging process. For example, a defective light emitting diode 110 may be removed, re-bonded, replaced, or an abnormal circuit may be cut. The packaging process may include, for example, forming the insulating layer 180 covering the substrate 102 on the substrate 102.

Thereafter, a light conversion layer forming process may be performed to form the light conversion layer 130 in the recesses 120H of the light conversion layer fixing structure 120. In the present embodiment, in the light emitting unit 104, the light conversion pattern 130a and the light conversion pattern 130b of different colors corresponding to the different light emitting region Ea and light emitting region Eb of the light conversion layer 130 may respectively be formed, but the present disclosure is not limited thereto. In some embodiments of the present disclosure, after the light conversion layer 130 is formed, a comprehensive planarization layer may be further formed to form a structure shown in FIG. 6A and FIG. 6B described later.

In an embodiment, after the process of FIG. 3A, the light emitting diodes 110 may be inverted to dispose the electrodes 150 on the first carrier substrate 190, and then the substrate 120F is removed. Next, the light conversion layer fixing structure 120 with the recesses 120H is formed on the light emitting diodes 110 by using an organic material such as a photoresist. Next, a light conversion layer fixing structure 120 is cut. For subsequent processes, please refer to the steps after FIG. 3B, and the electronic device 100 shown in FIG. 1 may be manufactured accordingly. In the present embodiment, the material of the substrate 120F may be, for example, sapphire, but the present disclosure is not limited thereto.

Figure 4A:
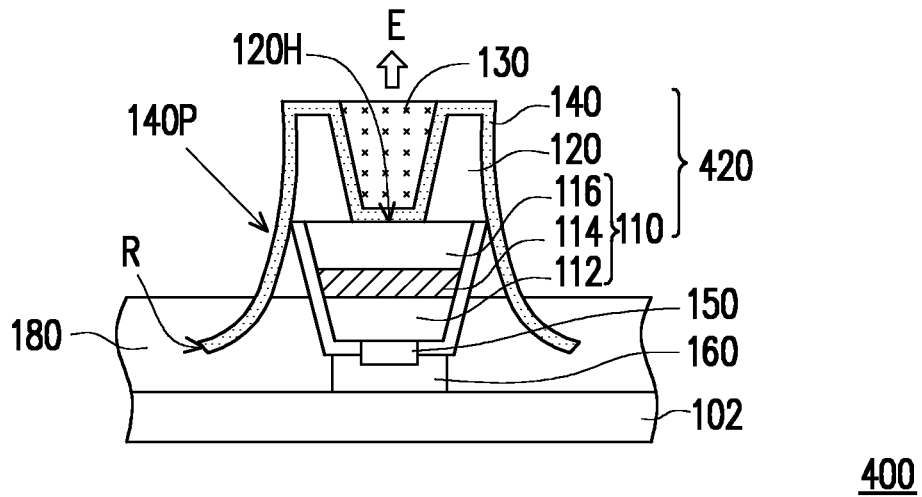
FIG. 4A to FIG. 4B are cross-sectional views of an electronic device of an embodiment of the present disclosure.
Figure 4B:
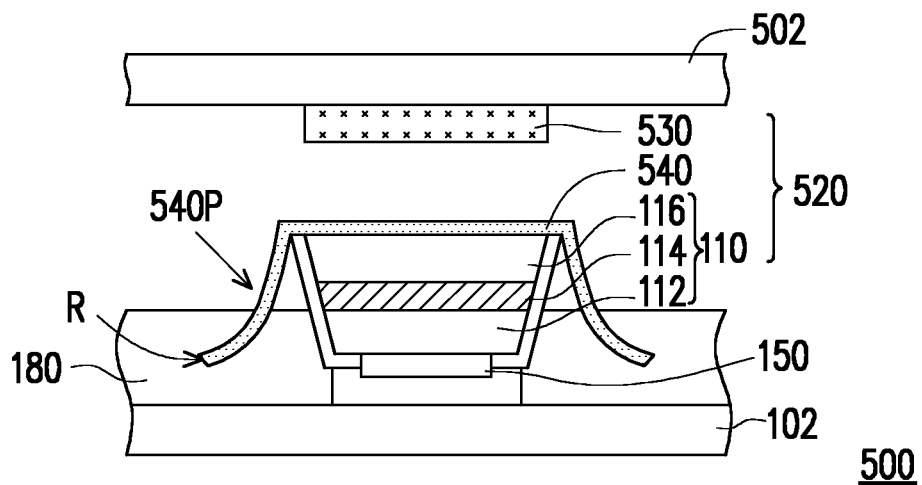

FIG. 4A to FIG. 4B are cross-sectional views of an electronic device of an embodiment of the present disclosure. Unless otherwise specified in FIG. 4A to FIG. 4B, the same reference numerals are the same as those in the above embodiments. In an electronic device 400 of FIG. 4A, the light emitting diode 110 may be a single light emitting diode (a single LED). In the light emitting unit 104 of the present embodiment, the light emitting unit may have a single light emitting region E. The recess 120H of the light conversion layer fixing structure 120 covers the light emitting region E in a top view of the electronic device 400, and the light conversion layer 130 is disposed in the recess 120H. The light emitting diode 110 may be, for example, a blue diode, but the present disclosure is not limited thereto.

In an electronic device 500 of FIG. 4B, a protective layer 540 may be directly formed on the light emitting diode 110. The protective layer 540 includes a portion 540P having the ripped section R and not overlapped with the light emitting diode 110. In the present embodiment, the protective layer 540 is in contact with the second doped semiconductor layer 116 of the light emitting diode 110. A light conversion layer 530 may be formed on an opposite substrate 502, and the orthographic projections of the light conversion layer 530 and the light emitting diode 110 on the substrate 102 are overlapped. In the present disclosure, unless specified, the term "overlap" may refer to "completely overlap" or "partially overlap". The material of the light conversion layer 530 may be the same as or similar to that of the light conversion layer 130 and is not repeated herein.

Figure 5A:
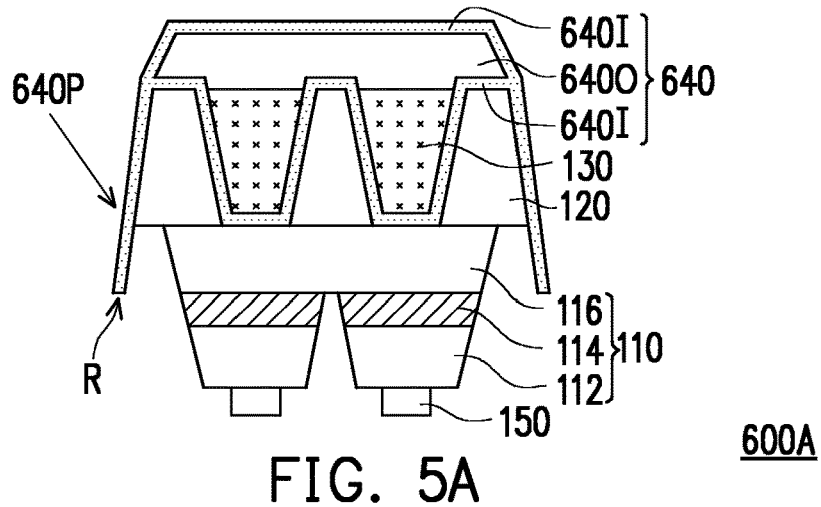
FIG. 5A to FIG. 5C are cross-sectional views of a light emitting unit in an electronic device of an embodiment of the present disclosure.
Figure 5B:
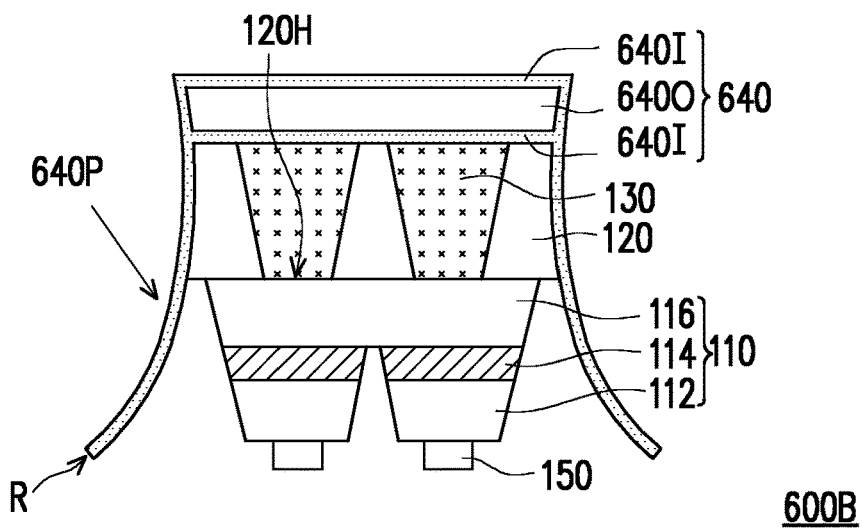
Figure 5C:
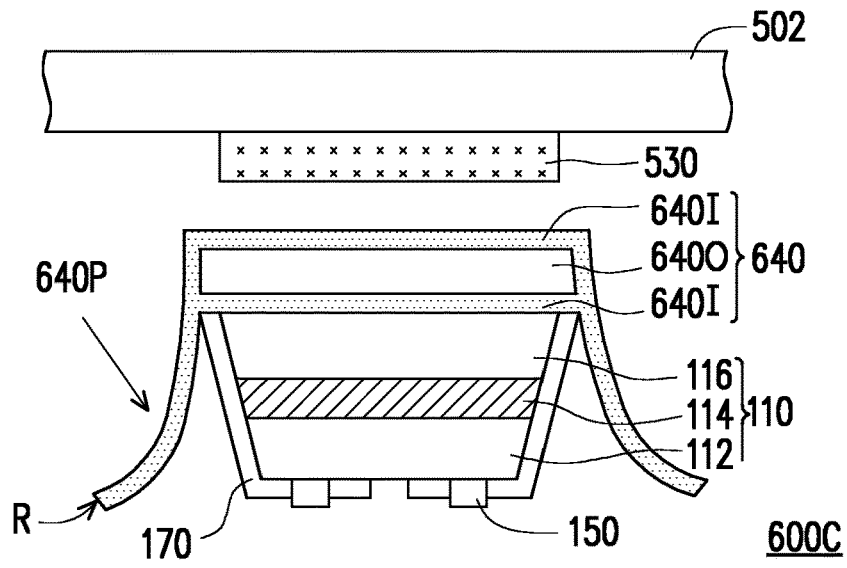

FIG. 5A to FIG. 5C are cross-sectional views of a light emitting unit in an electronic device of an embodiment of the present disclosure. Unless otherwise specified in FIG. 5A to FIG. 5C, the same reference numerals are the same as those in the above embodiments. In a light emitting unit 600A of FIG. 5A, a portion of a protective layer 640 overlapped with the light emitting diode 110 in a top view direction of the electronic device includes an inorganic material layer 640I and an organic material layer 640O, and a portion 640P of the protective layer 640 not overlapped with the light emitting diode 110 in the top view direction of the electronic device includes a ripped section R. In FIG. 5A, the light conversion layer 130 is disposed between the inorganic protective layer 640I and the organic protective layer 640O, and another inorganic protective layer 640I is further disposed on the organic protective layer 640O. The manufacturing method thereof may be the same as the methods of FIG. 3A to FIG. 3G and FIG. 1. After FIG. 3G, a step of forming the organic protective layer 640O and the inorganic material layer 640I is further included.

In a light emitting unit 600B of FIG. 5B, the light conversion layer 130 may be directly filled in the recesses 120H of the light conversion layer fixing structure 120, and the protective layer 640 is disposed on the light conversion layer 130 and the light conversion layer fixing structure 120. In the present embodiment, the protective layer 640 may include a stacked layer formed by the inorganic material layer 640I, the organic material layer 640O, and the inorganic material layer 640I on the top surface of the light conversion layer 130 in sequence, and the portion 640P of the protective layer 640 not overlapped with the light emitting diode 110 includes a ripped section R. In an embodiment, it is possible to only form the inorganic material layer 640I on the top surface of the light conversion layer 130, and it may omit the organic material layer 640O and the inorganic material layer 640I disposed above the organic material layer 640O and on the sides.

In a light emitting unit 600C of FIG. 5C, the protective layer 640 is directly in contact with the light emitting diode 110, and the protective layer 640 may sequentially include a stacked layer formed by the inorganic material layer 640I, the organic material layer 640O, and the inorganic material layer 640I on the top surface of the light emitting diode 110. In the present embodiment, as shown in FIG. 5C, the light conversion layer 530 may be formed on the opposite substrate 502. According to the embodiment disclosed in FIG. 5A to FIG. 5C, an inorganic/organic/inorganic stacking encapsulation structure may be formed above the light emitting diode 110, and the protective layer may have the denseness of the inorganic material and the flatness of the organic material. Moreover, the additional protection of the organic material layer may further reduce the impact received by the light emitting diode during a transfer process, thus reducing the chance of damage. Although the inorganic/organic/inorganic stacking encapsulation structure is shown in FIG. 5A to FIG. 5C, the present disclosure is not limited thereto. In other embodiments, the portion of the protective layer 640 overlapped with the light emitting diode 110 in a top view of the electronic device may include, but is not limited to, an inorganic/organic stacked layer, an organic/inorganic stacked layer, an organic/inorganic/organic stacked layer, an inorganic/organic/inorganic/organic stacked layer, or an organic/inorganic/organic/inorganic stacked layer. For example, organic/inorganic/organic stacked layer means that the inorganic layer is disposed on a first organic layer and a second organic layer is disposed on the inorganic layer.

It is worth noting that, in the light emitting unit 600B shown in FIG. 5B, the manufacturing method thereof may include, for example, after the step of FIG. 3D, first filling the light conversion layer 130 in the light conversion layer fixing structure 120, and then forming the protective layer 640 formed by the inorganic material layer 640I, the organic material layer 640O, and the inorganic material layer 640I, and then performing the processes of, for example, forming the protective layer 140 to disconnect the protective layer 140 as shown in FIG. 3E to FIG. 3G. In other words, in the present disclosure, the relative positions of the protective layer and the light conversion layer in the light emitting unit 104 may be adjusted by adjusting the sequence of the steps of filling the light conversion layer 130 and the protective layer 140 in FIG. 1 and FIG. 3E to FIG. 3G or the like.

Figure 6:
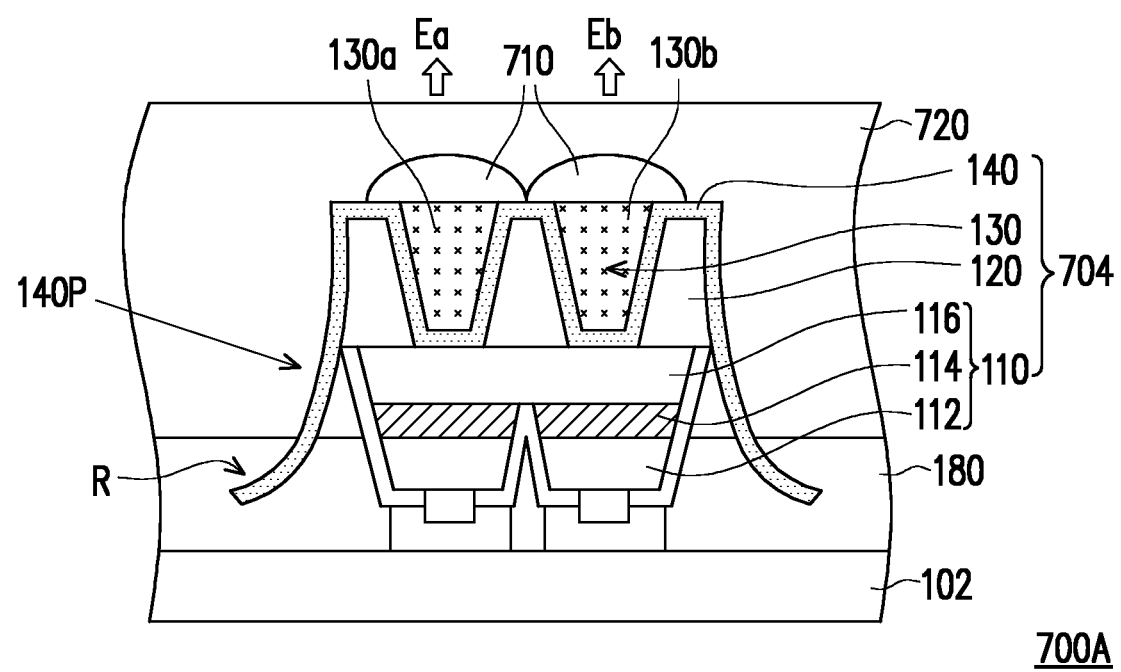
FIG. 6 is a cross-sectional view of an electronic device of an embodiment of the present disclosure.

FIG. 6 is a cross-sectional view of an electronic device of an embodiment of the present disclosure. For the description of the same reference numerals in FIG. 6 as those in FIG. 1, please refer to the above. In an electronic device 700A of FIG. 6, protective patterns 710 may be respectively disposed on the light conversion pattern 130a and the light conversion pattern 130b in the different light emitting region Ea and light emitting region Eb of a light emitting unit 704. The protective patterns 710 may be lenticular, but are not limited thereto. In some embodiments, the protective patterns 710 may be used to appropriately diverge the light emitted from the light emitting region Ea and the light emitting region Eb, reduce light collimation, or expand the range of the light emitting region Ea and the light emitting region Eb to more evenly emit light, but the present disclosure is not limited thereto. The material of the protective patterns 710 is, for example, an organic material such as epoxy resin. In addition, in FIG. 6, the electronic device may further include a planarization layer 720 disposed on the insulating layer 180, and the planarization layer 720 may cover the light emitting unit 704.

Figure 7A:
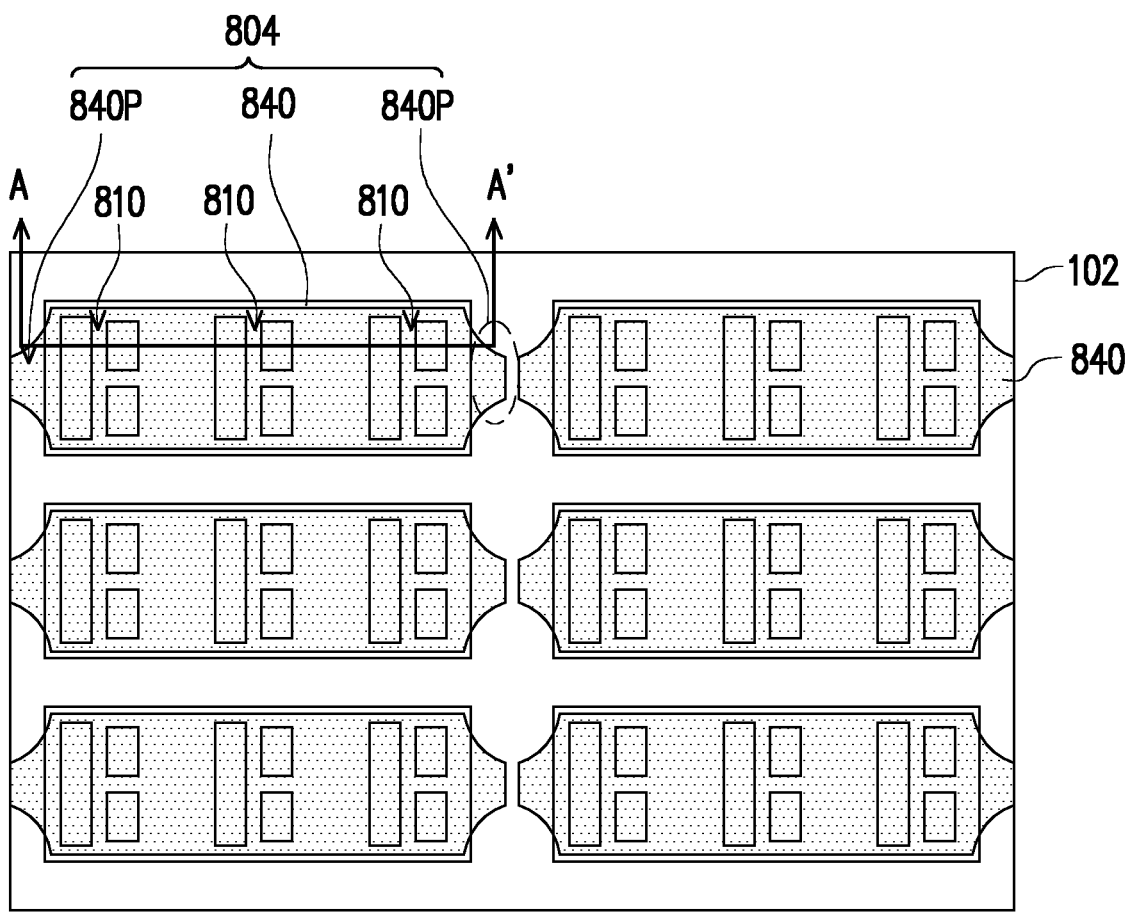
FIG. 7A is a top view of an electronic device of an embodiment of the present disclosure.
Figure 7B:
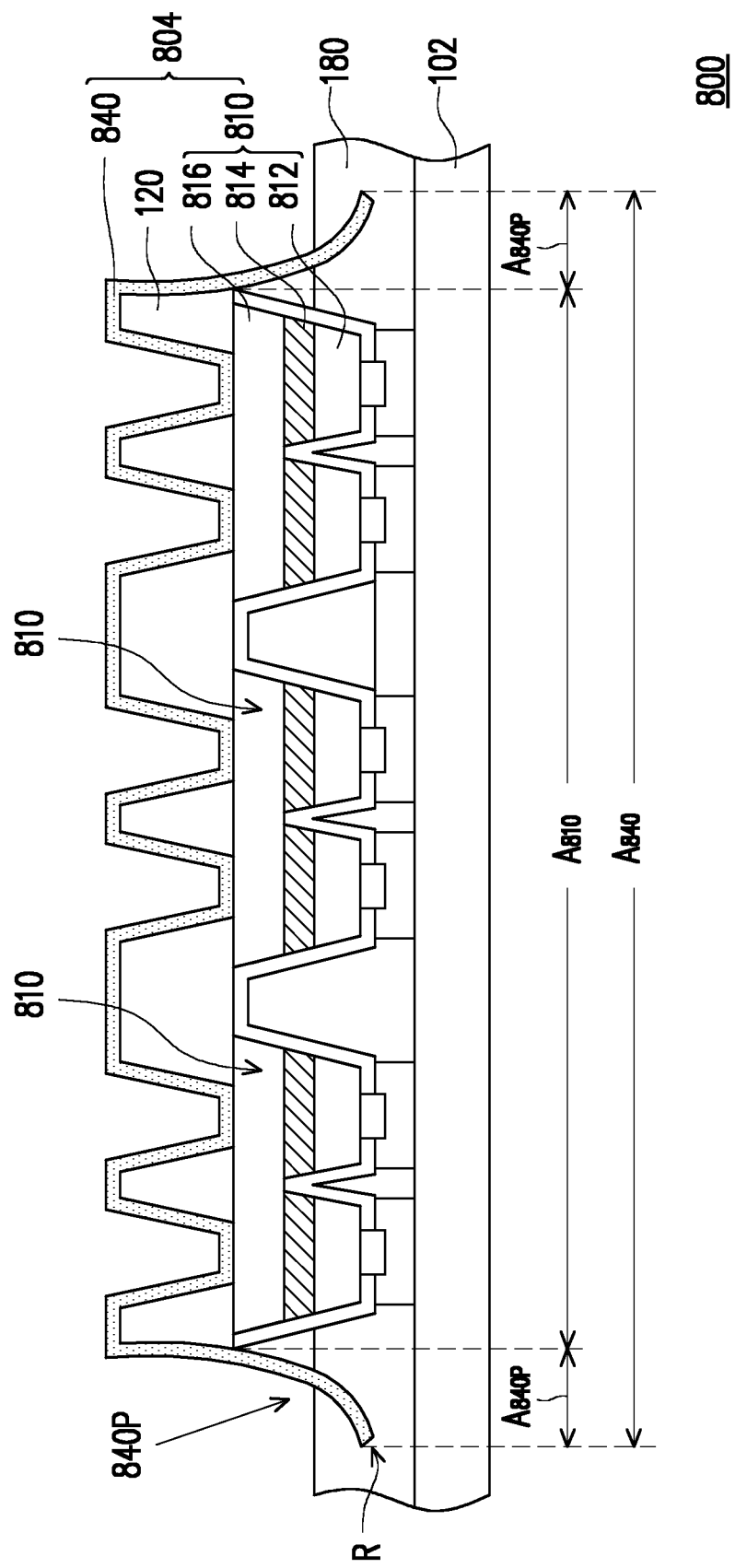
FIG. 7B is a cross-sectional view along section line AA' in FIG. 7A.

FIG. 7A is a top view of an electronic device of an embodiment of the present disclosure, and FIG. 7B is a cross-sectional view along section line AA' in FIG. 7A. For the description of the same reference numerals in FIG. 7A and FIG. 7B as those in FIG. 1, please refer to the above. However, in a light emitting unit 804 of an electronic device 800 in the present embodiment, a plurality of (for example, three) light emitting diodes 810 share a continuous protective layer 840. That is, in the same light emitting unit 804, the protective layer 840 on and among the light emitting diodes 810 may be continuous. In the same light emitting unit 804, the protective layer 840 disposed on the outermost light emitting diode 810 has a disconnected portion 840P, and the protective layer 840 disposed on the middle light emitting diodes is connected to the adjacent protective layer 840. As shown in FIG. 7A and FIG. 7B, three light emitting diodes 810 are in an orthographic projection region $A_{810}$ on the substrate 102. The region is, for example, three times of the size of the light emitting diode 810 plus two times of the spacing between adjacent two light emitting diodes 810. The orthographic projection region of the portion 840P with the ripped section R of the protective layer 840 on the substrate 102 is, for example, a region $A_{840P}$ in which an orthographic projection region $A_{840}$ of the protective layer 840 on the substrate 102 and the orthographic projection region $A_{810}$ of the three light emitting diodes 110 on the substrate 102 are not overlapped.

Figure 8A:
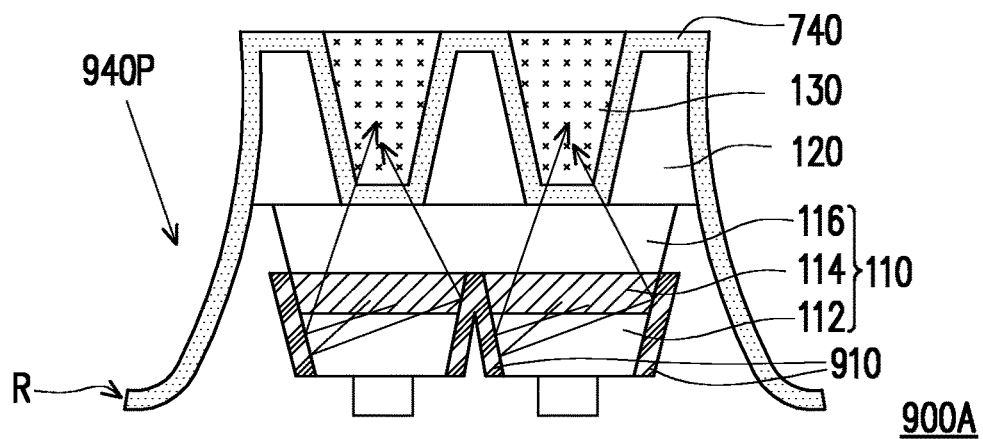
FIG. 8A is a cross-sectional view of a light emitting unit in an electronic device of an embodiment of the present disclosure.

FIG. 8A is a cross-sectional view of a light emitting unit in an electronic device of an embodiment of the present disclosure. Unless otherwise specified in FIG. 8A, the same reference numerals are the same as those in the above embodiments. In a light emitting unit 900A of FIG. 8A, a protective layer 940 includes a portion 940P having the ripped section R and not overlapped with the light emitting diode 110, and a reflective structure 910 may be provided on the outside and inside of the light emitting diode 110. The material of the reflective structure 910 may include an insulating material and/or a metal material. The insulating material may be, for example, an inorganic material, but the present disclosure is not limited thereto. For example, the reflective structure 910 may be formed by a plurality of inorganic layers such as an oxide film or a nitride film, and by modifying the n value (refractive index) of the film layer, the light emitted from the light emitting diode 110 may satisfy Bragg reflection to be totally reflected, but the present disclosure is not limited thereto. The reflective structure 910 may be used to focus light to be emitted toward a light emitting surface, thereby increasing the light utilization of the light conversion layer.

Figure 8B:
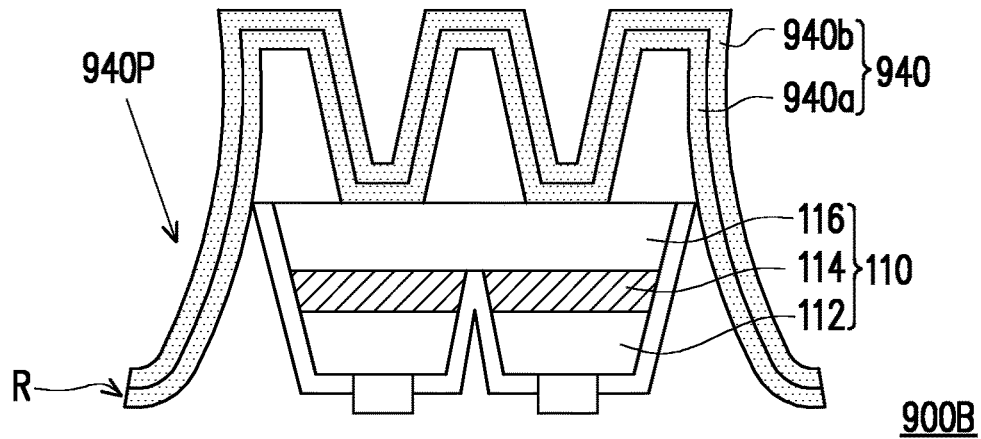
FIG. 8B and FIG. 8C are cross-sectional views of a light emitting unit in an embodiment of the present disclosure.
Figure 8C:
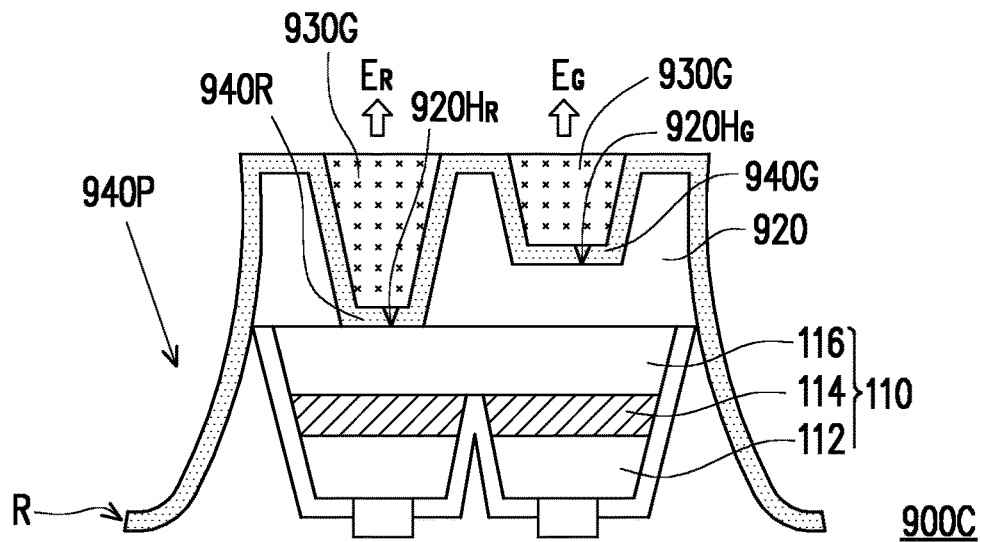

FIG. 8B and FIG. 8C are cross-sectional views of a light emitting unit in an embodiment of the present disclosure. For the description of the same reference numerals in FIG. 8B and FIG. 8C as above, please refer to the above. In a light emitting unit 900B of FIG. 8B, the protective layer 940 includes the portion 940P with the ripped section R. The protective layer 940 may be a reflective layer formed by a combination of different n value film layers, or formed by stacking a plurality of inorganic films. A higher refractive index film 940a and a lower refractive index film 940b are stacked on each other to form a Bragg reflection film, thereby increasing the light emitting efficiency.

In a light emitting unit 900C of FIG. 8C, a light emitting region $E_R$ and a light emitting region $E_G$ of different colors in a recess $920H_R$ and a recess $920H_G$ of a light conversion layer fixing structure 920 may have different depths and/or widths. Light conversion patterns 930R and 930G of different colors may be filled in the recess $920H_R$ and recess $920H_G$. Since light conversion patterns of different colors may have different light conversion efficiencies, the corresponding depths and/or widths may be different from each other. In another embodiment, different parts of the protective layer at different depths 920H may have different refractive index n values or different numbers of laminations, thereby increasing the light emitting efficiency. For example, the depth of the recess $920H_R$ of the light conversion layer fixing structure 920 in a red light region $E_R$ may be greater than the depth of the recess $920H_G$ in a green light region $E_G$. A protective layer 940R disposed in the red light region $E_R$ is, for example, formed by stacking three films. A protective layer 940G disposed in the green light region $E_G$ is, for example, formed by stacking five films. For example, stacked layers or films formed by different numbers of layers in the different light emitting region $E_R$ and light emitting region $E_G$ may be formed via a semiconductor process.

Figure 9A:
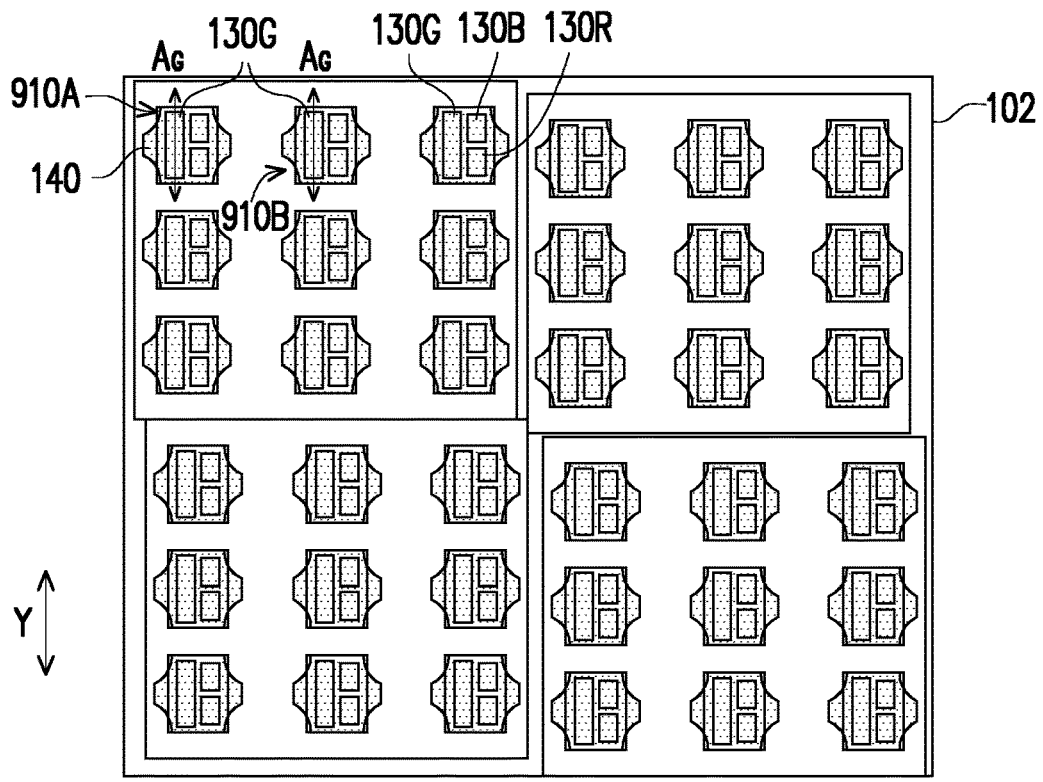
FIG. 9A is a top view of an electronic device of an embodiment of the present disclosure.

FIG. 9A is a top view of an electronic device in which the light emitting diodes are transferred onto a substrate by a stamp transfer process via a transfer head in an embodiment of the present disclosure. In the step shown in FIG. 3G, when light emitting units 910A and light emitting units 910B including the plurality of light emitting diodes 110 and the protective layer 140 are transferred from the second carrier substrate 210 to the substrate 102 in batches, the light emitting units 910A and the light emitting units 910B transferred in the same batch may usually be arranged neatly. However, when a mis-alignment occurs between the batches, it is easy for the human eye to observe uneven tiling between the batches.

Figure 9B:
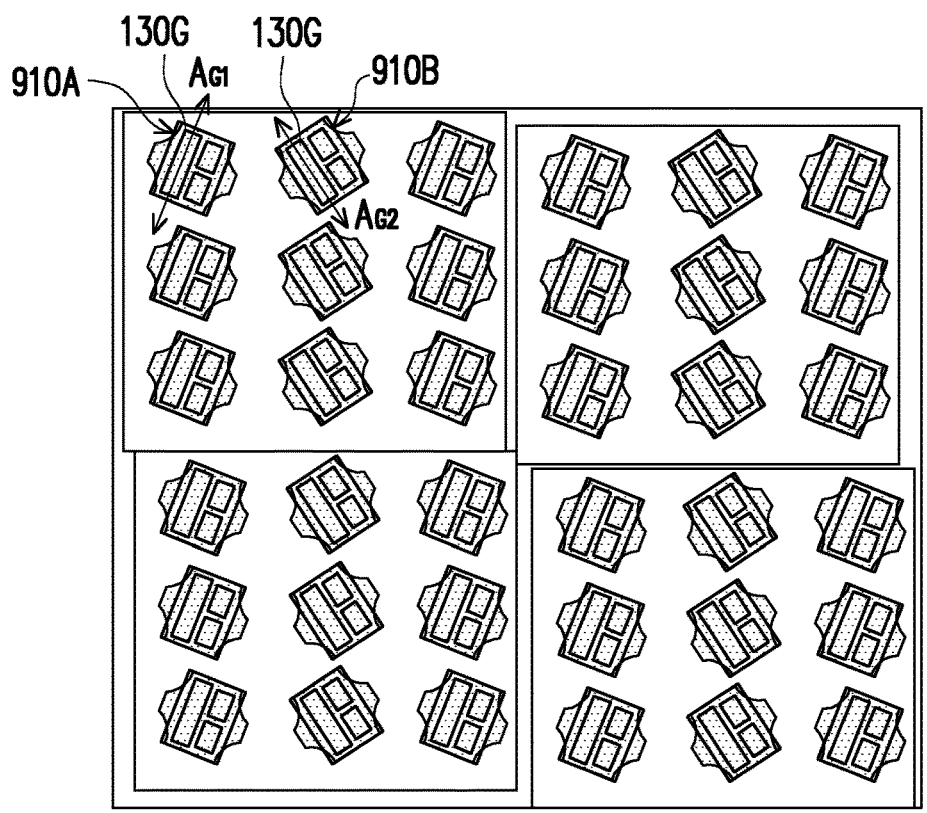
FIG. 9B is a top view of an electronic device of an embodiment of the present disclosure.

In order to reduce the phenomenon of uneven tiling, FIG. 9B is a top view of the electronic device of an embodiment of the present disclosure. The plurality of light emitting units 910A and light emitting units 910B have different arrangements before the light emitting units 910A and the light emitting units 910B are transferred to the target substrate 102 in the batches. For example, in the plurality of light emitting units 910A and light emitting units 910B in the same batch, the long axis direction (for example, a long axis direction $A_{G1}$) of the plurality of light emitting units 910A in a row may be different from the long axis direction (for example, a long axis direction $A_{G2}$) of the plurality of light emitting units 910A in an adjacent row, but the present disclosure is not limited thereto. Accordingly, the light emitting units 910A having different arrangements may blur the unevenness of the tiling and reduce the unevenness issue caused by the misalignment of the tiling. FIG. 9A shows that when the plurality of light emitting units 910A and light emitting units 910B are arranged neatly, the long axis directions AG of the light conversion layers 130 of the same color on the light emitting units 910A and the light emitting units 910B are substantially consistent. To be detailed, the light conversion patterns in the light emitting units 910A and the light emitting unit 910B may include a red light conversion layer 130R, a green light conversion layer 130G, and a blue light conversion layer 130B, respectively. For example, the long axis directions $A_G$ of the green light conversion layers 130R of the plurality of light emitting units 910A in FIG. 9A are consistent, and are substantially parallel to the Y direction.

In contrast, in FIG. 9B, after the arrangement of the plurality of light emitting units 910A and light emitting units 910B is disrupted, the long axis directions of the light conversion patterns of the same color in at least a portion of the light emitting units 910A and the light emitting units 910B may be inconsistent. As shown in FIG. 9B, in the light emitting unit 910A disposed in the first row and the first column, the long axis direction of the green light conversion layer 130G is labeled as $A_{G1}$, and in the light emitting unit 910B in the first row and the second column, the long axis direction of the green light conversion layer 130G is labeled as $A_{G2}$, and $A_{G1}$ and $A_{G2}$ are inconsistent.

Figure 10A:
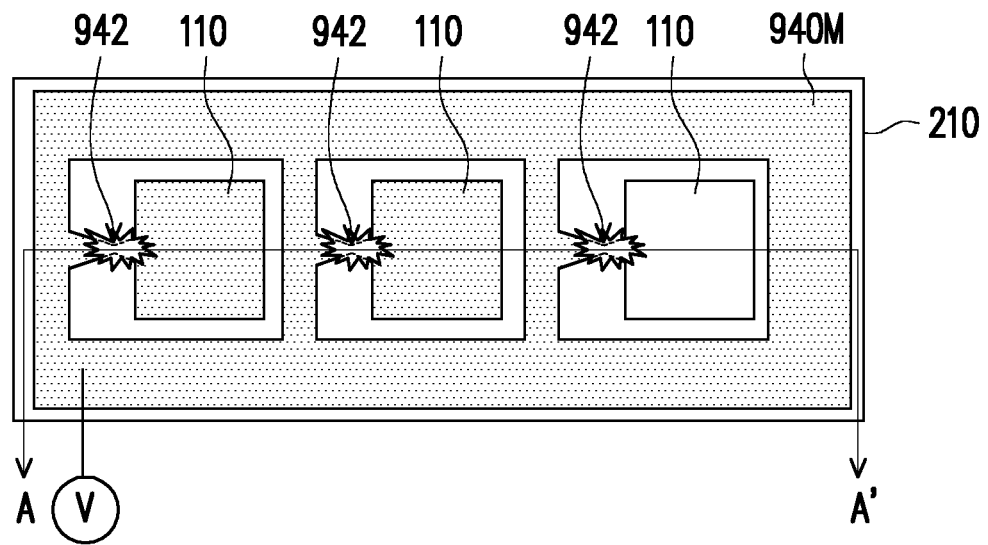
FIG. 10A and FIG. 10B are top views of a portion of a manufacturing process of a protective layer of an embodiment of the present disclosure.
Figure 10B:
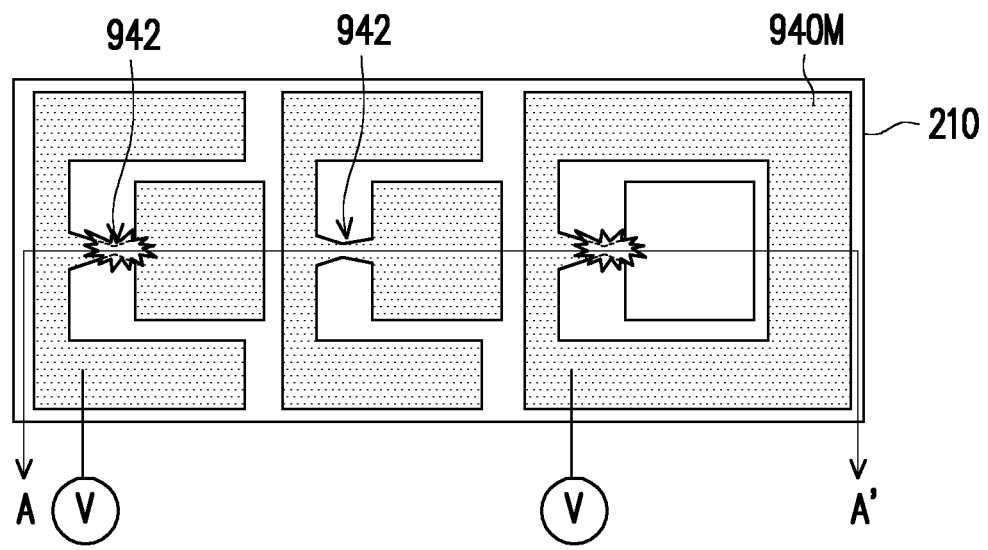
Figure 11A:
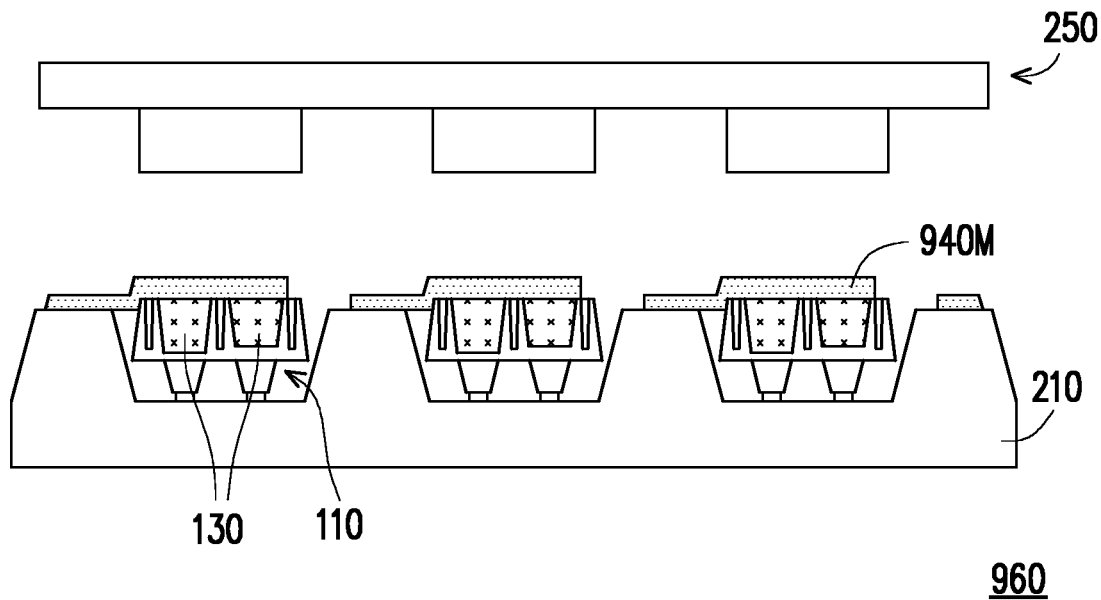
FIG. 11A and FIG. 11B are cross-sectional views along section line AA' in FIG. 10A and FIG. 10B.
Figure 11B:
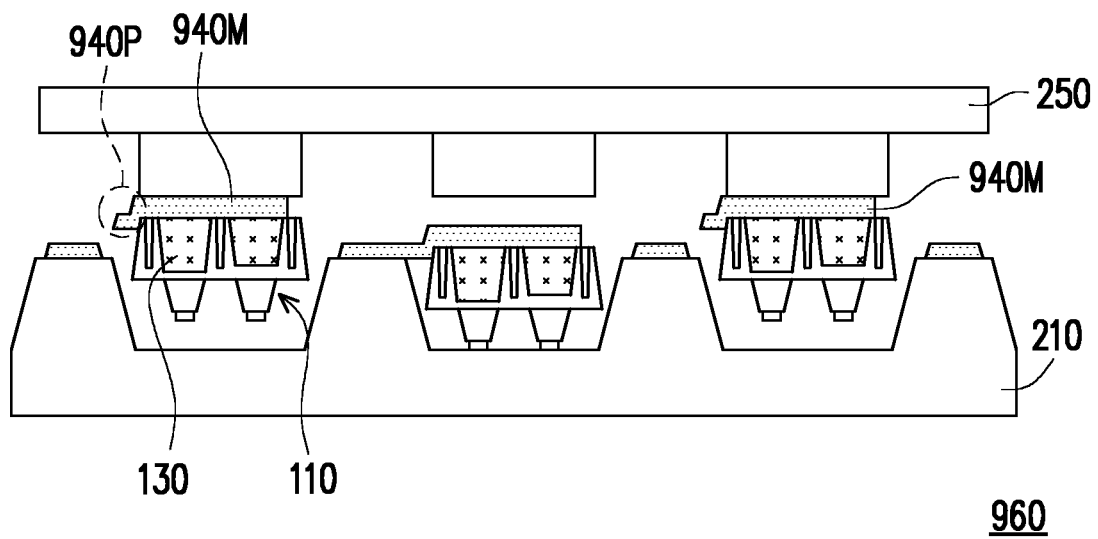

FIG. 10A and FIG. 10B are top views of a portion of a manufacturing process of a protective layer of an embodiment of the present disclosure, and FIG. 11A and FIG. 11B are cross-sectional views of FIG. 10A and FIG. 10B. The method for forming the protective layer may be shown in FIG. 10A and FIG. 10B and FIG. 11A and FIG. 11B in addition to the method of disconnecting the protective layer by using the transfer head 250 to press down as shown in FIG. 3G. The protective layer may include a conductive layer, and the top view and the cross-section view of the conductive layer are as shown in FIGS. 10A and 10B and FIG. 11A.

As shown in FIG. 10A and FIG. 11A, in a top view, a protective layer 940M has necking portions 942 spanning across the second carrier substrate 210 and the light conversion layers 130. Next, as shown in FIGS. 10A and 10B and FIG. 11B, a voltage is selectively applied to the protective layer 940M to achieve selective transfer. The necking portions 942 of the protective layer 940M may be blown out due to the application of a voltage to form an electronic device 960 shown in FIG. 11B, and the electronic device 960 includes the protective layer 940M of the portion 940P with the ripped section R above the light emitting diodes 110. In an embodiment, the width of the necking portions 942 is less than the width of the light emitting diodes 110. For example, the ratio of the width of the necking portions 942 to the width of the light emitting diodes 110 may be between 0.2 and 0.8 (0.2≤ratio≤0.8), such as 0.4 or 0.6, but the present disclosure is not limited thereto.

Figure 12:
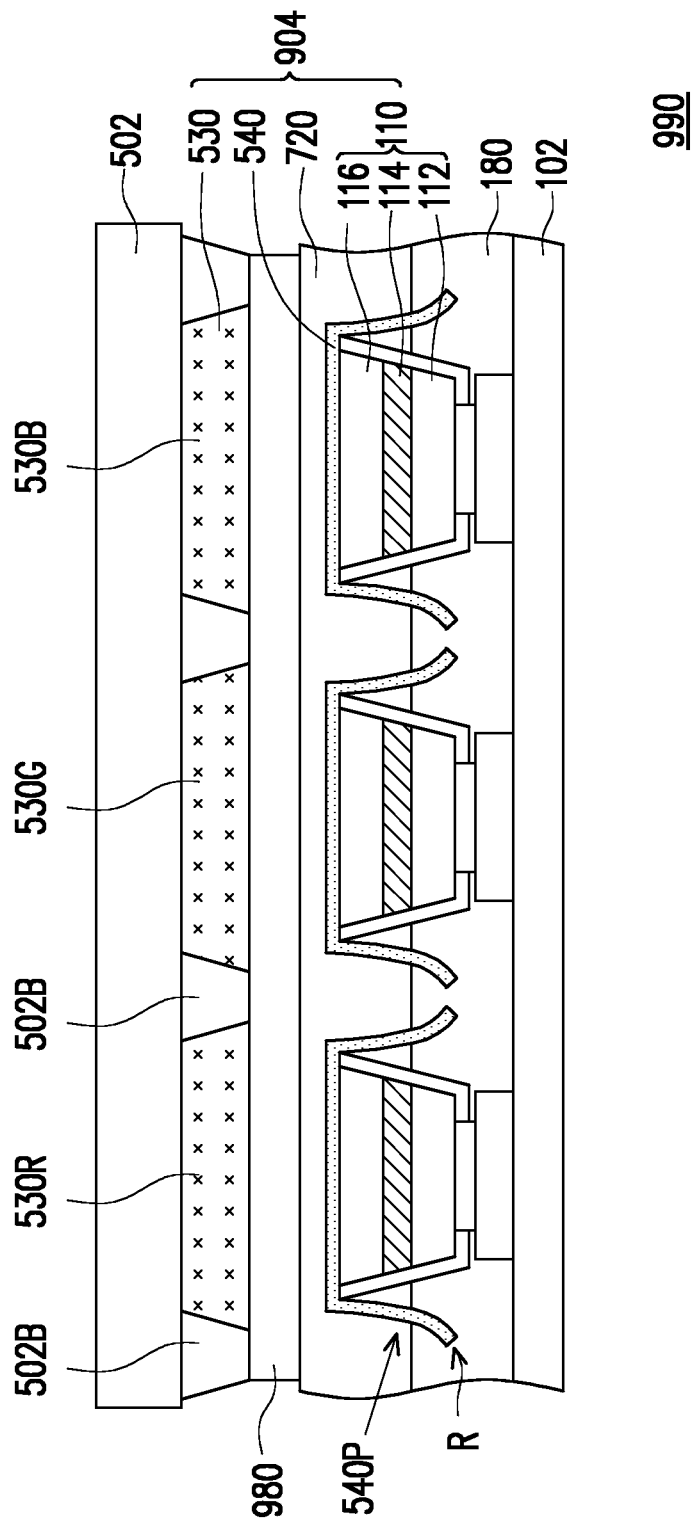
FIG. 12 is a cross-sectional view of an electronic device of an embodiment of the present disclosure.

FIG. 12 is a cross-sectional view of an electronic device of an embodiment of the present disclosure. An electronic device 990 includes the substrate 102 and light-emitting units 904, wherein the light-emitting units 904 may include the light emitting diodes 110, the protective layer 540, and the light conversion layer 530. The light emitting units 904 of the present embodiment are similar to FIG. 4B. The light emitting diodes 110 include the first doped semiconductor layer 112, the active layer 114, and the second doped semiconductor layer 116. The protective layer 540 has the portion 540P having the ripped section R and not overlapped with the light emitting diodes 110 in the top view direction of the electronic device 990. In the light emitting units 904 of the present embodiment, the light conversion layer 530 is disposed on the opposite substrate 502, for example. The opposite substrate 502 may include black matrix layers 502B and the light conversion layer 530 disposed between the black matrix layers 502B. For example, the light conversion layer 530 may include a red light conversion layer 530R, a green light conversion layer 530G, and/or a blue light conversion layer 530B respectively corresponding to the light emitting regions of the light emitting unit 904, but the present disclosure is not limited thereto. In addition, the planarization layer 720 and an adhesive layer 980 may be disposed between the protective layer 540 and the light conversion layer 530, and the adhesive layer 980 may be disposed between the planarization layer 720 and the light conversion layer 530. In some embodiments, the adhesive layer 980 may be omitted.

According to an embodiment of the present disclosure, a manufacturing method of an electronic device may include at least the following steps. A substrate is provided. At least one light emitting unit is formed on the substrate. The light emitting unit includes a light emitting diode, a protective layer, and a light conversion layer. The protective layer includes a portion having a ripped section and not overlapped with the light emitting diode in a top view direction of the electronic device.

In the electronic device of an embodiment of the present disclosure, the light emitting unit includes a portion having a ripped section and not overlapped with the light emitting diode in a top view direction of the electronic device. Accordingly, a protective layer having such a structure may more extensively protect the light emitting diode to achieve the effect of alleviating the intrusion of water vapor or oxygen to reduce the deterioration or damage of the light emitting diode due to the intruding water vapor or oxygen or the like. In addition, the extending portion of the protective layer extending outward from the light emitting diode may reduce contact of the film layer formed in a subsequent process on the light emitting diode, thereby alleviating the influence of the subsequent process(es) on the performance of the light emitting diode.

In some embodiments, the light emitting unit may be provided with an inorganic/organic/inorganic protective layer on the top surface, and an insulating layer and a planarization layer or the like may also be disposed on the substrate to further reduce the influence of the external environment on the light emitting diode. In some embodiments, the light emitting unit may include an insulating reflective structure, or the protective layer may have different refractive indices in light conversion layers corresponding to different colors, or the light conversion layers of different colors may have different filling thicknesses to increase the light utilization of the light conversion layers. In some embodiments, the long axis directions of the light conversion patterns of the same color in a plurality of the light emitting units may be made inconsistent, thereby reducing the phenomenon of uneven tiling caused by misalignment during tiling. In general, the light emitting device of the present disclosure may provide improved light emitting effect to improve the quality of the electronic device.

Although the present disclosure is described with reference to preferred aspects, those skilled in the art may recognize that changes may be made in form and detail without departing from the spirit and scope of the present disclosure. As long as the features between the embodiments do not violate the spirit of the present disclosure or conflict with each other, they may be mixed and used arbitrarily.

What is claimed is:

1. An electronic device, comprising:
   a substrate; and
   at least one light emitting unit disposed on the substrate, the at least one light emitting unit comprising:
   a light emitting diode; and
   a protective layer,
   wherein the protective layer comprises a portion overlapped with the light emitting diode, and the portion has a concave part adjacent to an edge of the light emitting diode in a top view of the electronic device,
   wherein the protective layer further comprises another portion which is not in contact with the light emitting diode, and the another portion of protective layer comprises a ripped section,
   wherein the at least one light emitting unit further comprises a light conversion layer, the light conversion layer is located corresponding to a light emitting region of the light emitting diode, and the light conversion layer comprises a plurality of light conversion patterns of different colors.

2. The electronic device according to claim 1, wherein the light conversion layer is in contact with the protective layer.

3. The electronic device according to claim 1, wherein the protective layer extends outward from the light emitting diode in the top view of the electronic device.

4. The electronic device according to claim 1, further comprising another substrate disposed opposite to the substrate, wherein the light conversion layer is disposed on the another substrate.

5. The electronic device according to claim 4, further comprising a plurality of black matrix layers, wherein the light conversion layer is disposed between the black matrix layers.

6. The electronic device according to claim 4, further comprising an adhesive layer disposed between the light conversion layer and the protective layer.

7. A light emitting unit, comprising:
   a light emitting diode; and
   a protective layer,
   wherein the protective layer comprises a portion overlapped with the light emitting diode, and the portion has a concave part adjacent to an edge of the light emitting diode in a top view,
   wherein the protective layer further comprises another portion which is not in contact with the light emitting diode, and the another portion of protective layer comprises a ripped section,
   wherein the light emitting diode has a light emitting region, the light emitting unit further comprises a light conversion layer disposed on the protective layer and corresponding to the light emitting region, and the light conversion layer comprises a plurality of light conversion patterns of different colors.

8. The light emitting unit according to claim 7, wherein the light conversion layer is in contact with the protective layer.

9. The light emitting unit according to claim 7, wherein the protective layer extends outward from the light emitting diode in the top view.

* * * * *